April 14, 1970 E. GROSCHWITZ 3,506,925
ACTIVE COMPONENT FOR GENERATING AND AMPLIFYING
ULTRAHIGH FREQUENCY SIGNALS
Filed Feb. 21, 1968 5 Sheets-Sheet 1

April 14, 1970 E. GROSCHWITZ 3,506,925

ACTIVE COMPONENT FOR GENERATING AND AMPLIFYING ULTRAHIGH FREQUENCY SIGNALS

Filed Feb. 21, 1968 5 Sheets-Sheet 3

April 14, 1970 E. GROSCHWITZ 3,506,925

ACTIVE COMPONENT FOR GENERATING AND AMPLIFYING ULTRAHIGH FREQUENCY SIGNALS

Filed Feb. 21, 1968 5 Sheets-Sheet 4

United States Patent Office 3,506,925

Patented Apr. 14, 1970

3,506,925

ACTIVE COMPONENT FOR GENERATING AND AMPLIFYING ULTRAHIGH FREQUENCY SIGNALS

Eberhard Groschwitz, Munich, Germany, assignor to Siemens Aktiengesellschaft, a corporation of Germany Filed Feb. 21, 1968, Ser. No. 707,118
Claims priority, application Germany, Mar. 14, 1967, S 108,800
Int. Cl. H01s 3/08
U.S. Cl. 330—4.3 24 Claims

ABSTRACT OF THE DISCLOSURE

An active component for generating and amplifying ultra high frequency signals comprises a light source which radiates optical radiation into a first solid state layer of degenerated electron concentration having a thickness sufficient for complete absorption of the optical radiation and at least in the order of magnitude of a few damping lengths of electrons photolectrically excited in the first layer but not larger than in the order of $10^2$ to $10^3$ of the damping lengths. A second layer adjacent to and forming a junction with the first layer comprises semiconductor material of $p$ conductivity type having a statistically degenerated defect-electron enrichment layer. The second layer has ohmic contacts for applying blocking direct voltage between the first and second layers. The optical radiation of the light source has a frequency corresponding to a photon energy greater than the work function of the hot electrons issuing from the first layer into the conduction band of the semiconductor material and has an intensity at which the median concentration of the localized hot electron cloud occurring at the junction between the first and second layers with a determined blocking direct voltage applied thereto via the ohmic contacts is comparable in order of magnitude with the median concentration of the defect-electron enrichment layer of the semiconductor material.

DESCRIPTION OF THE INVENTION

My invention relates to an active component for generating and amplifying ultrahigh frequency signals. More particularly, my invention relates to an active component for generating and amplifying ultrahigh frequency signals in the frequency range between the maximum communication technical frequency and long wave infrared frequency which is $10^9$ to $10^{13}$ cycles per second or hertz.

Specific transistor types are used at the present time in the field of communication technical high frequencies, which transistor types are known as masa transistors, planar transistors, post-alloy diffusion transistors, and so on. In these transistors, the high limit frequency is attained essentially as a result of a correspondingly low base resistance and a small internal collector capacitance. From a physical point of view, processes of the charge carrier movements play a decisive part in such transistor types and occur partly within a length magnitude of $10^{-4}$ cm. This is predicated upon the possibility of a technological realization of producing correspondingly thin semiconductor layers with high-quality electrical properties.

The technological methods used for in-alloying, in-diffusion, vapor deposition, oxidation, masking and epitaxy have reached such a high degree of perfection that the physical conditions necessary to provide the very high frequencies in the aforementioned maximum frequency transistors are attainable in mass production.

The cycle periods in the order of magnitude of $10^{-9}$ sec., which correspond to the limit frequencies, have a specific upper limit in the aforementioned transistors. The upper limit is inherent in the alternating drift movement of the movable charge carriers within the geometrical dimensions of the aforementioned magnitude.

Methods have recently been suggested and partially realized for amplifying frequencies considerably higher than $10^9$ hertz by utilizing semiconductor components. These methods primarily involve the semiconductor-metal-semiconductor triode with a Schottky-barrier emitter, the tunnel-emitter triode and the triode with a space-charge limited emitter. In these transistor types, electrons are emitted from a semiconductor emitter of $n$ conductivity type to a thin metal base, via a semiconductor metal contact barrier, poled in the forward direction. The emitted electrons have an excess energy inside the metal base over the Fermi level and such energy is controllable by a potential, so that the electrons penetrate the metal base as hot electrons and are collected in a metal semiconductor collector of $n$ conductivity type poled in the inverse direction.

For the extremely high frequencies used in communications, it is of fundamental importance that the hot electrons emitted by the metal base reach the conduction band of the inversely poled semiconductor collector directly. In the conduction band, the electrons, acting as additional majority carriers, then control and amplify the inverse current, which is comprised only of electrons of the metal semiconductor contact. The disturbances, caused by the additional majority carriers, affecting the electrochemical dynamic reaction equilbrium between the mobile load carriers and dopant atoms, decay within a dielectric relaxation period which depends upon the concentration of the conduction electrons. This period may be of shorter duration, for example by several orders of magnitude, than the life span of injected minority carriers which, in addition to the time of travel in the transistor base, indicate the characteristic time constant of the conventional transistors. For the aforedescribed reasons, it is possible when injecting hot electrons as majority carriers into a semiconductor region of $n$ conductivity type to raise the limit frequency of the metal base transistors, operating according to this principle, by two to three orders of magnitude.

The aforementioned metal base transistor types which represent the present state of the art for attaining the maximum frequency are, on the other hand, afflicted with characteristic deficiencies inherent in their mode of operation. These shortcomings are hereinafter described.

The hot electrons in the metal base are driven by a forward voltage in a semiconductor region of $n$ conductivity type positioned ahead of the metal base. The excitation energy of the hot electrons in the metal base and their plasma temperature are thus determined there by the practically invariable energy level of the emitter contact potential of the semiconductor metal contact. Thus, however, sharply limits the sensitivity as well as the yield of the source delivering the hot electrons. Thus, the barrier of the contact potential, which is largely unvaried due to the nature of the contacted materials, effects an energetic rigidity of the excitation mechanism which is of little benefit, for example, to the control speed, the modulation ability and the amplification.

With regard to the yield of the semiconductor metal emitter acting as a source for hot electrons, an essential part is played particularly by the travel time of the electrons in the semiconductor region of $n$ conductivity type positioned ahead of the metal base. This travel time characterizes the electronic inertia of the hot electron-producing excitation mechanism. Such excitation mechanism is fixed, energywise, through the contact potential of the emitter with respect to its potential threshold and therefore also has electronic inertia compared to time variations in the concentration of the conduction electrons to be utilized in the collector behind the metal base. Since such concentration fluctuations in the collector are to be controlled at a very high frequency by the hot electrons in the aforementioned order of magnitude, the electronic inertia on the emitter side within the limits of the available, relatively slow, travel time, is undesirable. The known metal base type transistors thus cause the undesirable result that the unavoidable travel time effects occurring on the emitter side limit the control of the varying time processes in the collector due to electronic inertia which cannot be reduced. Thus, the advantage of amplifying higher frequencies than before must be paid for with relatively weak communication technique characteristics or qualities. Among other transmission weaknesses resulting from these shortcomings is, for example, the relatively low degree of amplification.

To facilitate an understanding of the subsequent embodiments, the principal features of the disclosed electronic disadvantages of the known metal base transistors are summarized as follows. There is too much inertia of electron travel in the conduction band of the emitter which produces the hot electrons, as compared to the time processes of the majority carrier injection of the collector mechanism. There is an insufficient yield by the emitter during the production of hot electrons, due to the threshold value of the contact potential of the emitter metal base contact, which exponentially reduces the emitter current. There is an undesired reduction in the modulation capacity of the transmitted control function of the emitter due to the threshold of the contact potential which is unalterably fixed by the material properties of the emitter metal contact. There are conditions which are difficult to reproduce with respect to the arbitrarily selected examples of equivalent electron travel in the metal base, with regard to the fact that as hot electrons such electrons must first traverse the entire thickness of the metal base before they are injected into the conduction band of the collector.

The active component of my invention is a generator and an amplifier for frequencies within the frequency range of $10^9$ to $10^{13}$ hertz and eliminates the aforedescribed disadvantages of known components.

In accordance with the present invention, an active component for generating and amplifying ultrahigh frequency signals comprises a light source which radiates an optical beam into a solid state first layer with degenerated electron concentration, which first layer is preferably metal. A second layer adjacent to the first layer comprises semiconductor material of *p* conductivity type having a statistically degenerated defect-electron enrichment layer. The solid state first layer of degenerated electron concentration has a thickness sufficient for complete absorption of the optical radiation, which is preferably coherent, and which is at least in the order of magnitude of a few damping lengths of the electrons photoelectrically excited in the first layer but not larger than in the order of $10^2$ to $10^3$ of the damping lengths. The frequency of the optical radiation of the light source corresponds to a photon energy greater than the work function of the hot electrons issuing from the first solid state layer into the conduction band of the adjacent semiconductor material. The optical radiation has an intensity which is such that the density of the electrons issuing from the first layer into the conduction band of the semiconductor material is so large that the median concentration of the localized hot electron cloud occurring at the junction between the first and second layers with a determined blocking voltage applied thereto, via ohmic contacts of the second layer is comparable in order of magnitude with the median concentration of the defect-electron enrichment layer of the semiconductor material. The ohmic contacts of the second layer apply blocking direct voltage between the first and second layers.

Additional details of my invention are hereinafter disclosed and embodiments of my invention are illustrated in FIGS. 5, 6 and 7.

The varying processes within the range of extremely high frequencies on which the invention is based occur, due to carrier movements, in a high-conducting semiconductor layer of *p* conductivity type adjacent a thin solid state layer with degenerated electron concentration. The band structure of the solid state layer must permit a photoelectronic excitation of hot electrons and, compared to the relative energy level of the adjacent semiconductor layer of *p* conductivity type, must be so conditioned that when the crystal lattice is photoelectrically excited it functions as a reservoir of hot electrons exclusively for the conduction band of the adjacent semiconductor layer. Due to their excitation energy, the hot electrons are emitted in the form of a plasma flow of high kinetic energy into the conduction band of the semiconductor layer of *p* conductivity type. The photoelectrically excited electron issuing or emitting solid state layer may, for example, be a metal having appropriate electronic properties. The solid state layer with degenerated electron concentration is preferably a metal layer, but may comprise a suitably doped semiconductor layer.

A solid state layer with degenerated electron concentration is intended to mean a conducting or semiconducting material or medium wherein the concentration of the conduction electrons is higher than the degenerating concentration. At room temperature, the degenerating concentration has a value of approximately $10^{19}$ cm.$^{-3}$. When a semiconducting material or medium is used, this requires an extremely high doping with donors. The degeneration condition is always inherent in a metallic conductor. Furthermore, the electron cloud, during degeneration, is not determined by the laws of the Boltzmann statistic, but by the Fermi statistic. More specific details pertaining to this matter are found in the book "Electronic Semiconductors," by E. Spenke, published by Springer, Berlin-Göttingen-Heidelberg, 1955, chapter VIII called "Fermi Statistic of Crystal Electrons," pages 270 and following.

Although, according to a special embodiment of the present invention, an appropriately doped semiconductor may be used as the solid state layer, with degenerated electron concentration, a metal layer is preferred. In the following explanations, descriptions and disclosure, the solid state layer with degenerated electron concentration is described as a metal layer.

The doping to *p* conductivity type of the semiconductor layer adjacent the solid state layer with degenerated electron concentration is sufficiently high so that it represents a statistically degenerated semiconductor. The respective varying processes are induced by an electrodynamic coupling two different basic electronic processes having special characteristics.

One basic process depends upon the fact that with the aid of an adjustable bias potential inversely poled defect-electrons of high kinetic energy or hot defect-electrons are emitted as majority carriers from the border of the metal layer into the valence band of the semiconductor region of *p* conductivity type. The hot defect-electrons occur in the valence band of the semiconductor layer, which has a statistically degenerated defect-electron enrichment when blocking currents are applied at the boundary of said semiconductor layer and the metal layer at the energy level of the quasi-Fermi level of the defect electrons, which at such point is considerably below the upper limit of the valence band. When a blocking or bias voltage is applied, electrons immediately approaching the quasi-Fermi level, submerged in the valence band of the semiconductor, of the statistically degenerated defect-electron enrichment, pass from the valence band of the semiconductor into the metal layer. The defect-electrons of high kinetic energy, which are similarly produced during the aforedescribed process, are thus issued or emitted from the metal layer, injected into the valence band of the semiconductor layer, and directed into the semiconductor region of *p* conductivity type by the electric field of the applied blocking voltage. The fast defect-electrons traverse the space charge region which, at the high enrichment of defect-electrons in the valence band, is relatively small even when there is a blocking voltage. The defect-electrons pass through the space charge region essentially directly with pulse or relaxation effects and constitute, when impinging upon the quasi-neutral semiconductor plasma, its supply rate of enriched defect-electrons.

It is of primary importance to the electronic conditions discussed that the production of defect-electrons of high kinetic energy should be subjected to electrodynamic control at the boundary of the metal and semiconductor layers, as well as that their emission or issuance into the valence band of the semiconductor be electrodynamically controlled by another special basic electronic process in the same spatial area or region of said semiconductor.

This second basic electronic process relates to a plasma flow of additional hot electrons of collective movement type in the combination band of the semiconductor layer. The energy source of the electron flow is a photoelectric excitation within the metal layer and is therefore fundamentally dependent upon the aforementioned production of enriched defect-electrons. The hot electrons, whose concentration is variable and is comparable with the order of magnitude of enrichment of the defect-electrons, are modulatably issued or emitted, due to their high kinetic starting energy in the same direction of movement as the enriched defect-electrons, but in opposition to the electric field of the applied blocking voltage, from the metal layer and are injected into the conduction band of the semiconductor layer of *p*-conductivity type up to a specific depth of penetration determined by the adjustable electrical conditions. Following the emission of the hot electrons from the metal layer into the conduction band of the semiconductor, said electrons constitute an inherently refluxing electron plasma in the opposing electric field of the applied blocking voltage, under the action of the entire electrochemical counter-force which arises from the foregoing conditions.

The hot electrons issued or emitted into the conduction band are thus driven back in the direction of the metal layer and with regard to the time and space median or average, they form an electron cloud in the semiconductor layer of *p*-conductivity type during their reverse movement. The collective electrons represent in the semiconductor, within a spatial area or region approximately $10^{-6}$ to $10^{-5}$ cm. in depth, measured perpendicularly to the boundary of the metal layer, a high-grade condition of unbalance. The unbalance condition may be maintained by compensating the loss, occurring due to recombination and return travel to the metal layer, by a supply of hot electrons from said metal layer. The excited collection of hot electrons is an oscillating system. The high frequency oscillations of the electron cloud are produced by the return movement of the hot electrons emitted from the metal layer into the conduction band of the semiconductor layer.

The high frequency oscillations are important in communications technology, since with respect to the space and time median or average, they approximately represent and insure the character of a collective movement controlled by phase correlation, as compared with purely statistical oscillations. The collective character of the oscillations of the hot electrons in the conduction band is insured by two conditions, of which one is essentially spontaneous and the other is produced artificially.

The spontaneous condition is obtained from the electrodynamic variation effect occurring between the electron cloud of hot electrons emitted from the metal layer into the conduction band of the semiconductor layer and the plasma flow of enriched defect-electrons, which are also emitted from the metal layer into the valence band of the semiconductor layer. The production and travel of the defect-electrons within the semiconductor is thus electrodynamically controlled by the hot electrons in the conduction band of the semiconductor layer. The oscillations of the electron cloud produced in the conduction band are transmitted to the plasma flow of enriched defect-electrons and the pulsations of the flowing defect-electron plasma occurring thereby react upon the oscillations of the hot electrons in the conduction band.

The specific mechanism of a double emission which is variably produced and occurs locally at the metal layer oscillates at the oscillation frequency of the hot electron cloud and automatically effects a proper phase variation reduction of the partial space charge limit of the partial emission currents and represents an internal feedback between collective carriers issued or emitted into the semiconductor.

Because of the very high frequencies which occur due to the high carrier concentration, the varying electrodynamic control is primarily produced by the dielectric displacement current of the time and space load variations in the collective carriers. The effect of the feedback upon the oscillations of the entire semiconductor plasma of hot electrons and enriched defect-electron results, on the average, in a phase-controlling tendency as well as in the effects of amplification or generation of oscillations.

The other aforementioned artificially-produced condition consists in a photoelectric excitation of the hot electrons in the metal layer by light, optical radiation or an optical beam. The thickness of the metal layer provides, on the one hand, a complete absorption of the optical-radiation and, on the other hand, has an order of magnitude of at least a few damping lengths of the photoelectrically excited electrons in the metal layer, said order of magnitude being no larger than $10^2$ to $10^3$ damping lengths. The hot electrons emitted or issued into the conduction band of the semiconductor layer asume characteristics under the excitation conditions which represent an electron current flow with essentially controlled phase.

The basic internal electronic processes hereinbefore disclosed in accordance with my invention are illustrated in a few of the figures which are schematic diagrams showing the quantum-mechanical energy conditions of a component of my invention and constitute a qualitative description of the electrical processes which are essential for my invention. The different figures illustrate different operating conditions.

In order that the present invention may be readily carried into effect, it will now be described with reference to the accompanying drawings, wherein.

In each of FIGS. 1 to 4, the vertical direction corresponds to the energy of the electrons and the defect-electrons in the crystal lattice. The characteristic electronic processes of the present invention are essentially shown in their respective spatial extensions in a horizontal direction and in one dimension. The vertically plotted energy values, as well as the length dimensions which are presented in the horizontal direction, are only qualitative and are intended to provide an easier understanding of the electronic processes discussed and to illustrate physical conditions. The following observations are for the purposes of explanation and illustration, are general, encompass many substances, and are not bound to a specific geometric structure or arrangement.

Figure 1:
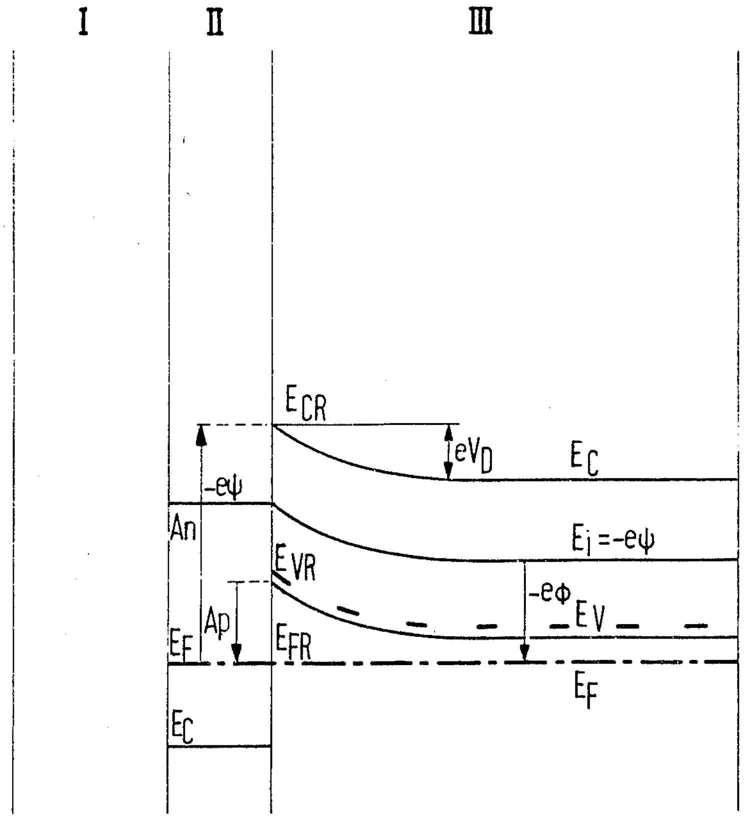
FIGS. 1, 2, 3 and 4 are schematic diagrams showing the quantum-mechanical energy conditions of an active component of the present invention under different operating conditions.

FIG. 1 illustrates the unloaded operational condition of the thermal balance. The essential areas of the present invention are the medium I, serving as a light or optical radiation source, the thin first metal layer II, and the second semiconductor layer or region III of $p$ conductivity type. Since the medium I, which is the radiation source, may have variable qualities and since, in the operational condition of the thermal balance, its function to photoelectrically exicte the hot electrons in the metal layer II may not occur, there is no specific characterization of the medium I in FIG. 1.

The fact that in FIG. 1 the metal layer II and the adjacent semiconductor region or layer III are in mutual thermal equilibrium, is expressed by a common or mutual Fermi level $E_F$, which extends through both layers horizontally and at the same level. Other characteristic energy curves are the lower level $E_C$ of the conduction band in the metal layer II and in the semiconductor region III.

The semiconductor region III also includes the upper level of the valence band $E_V$, as well as the Fermi level of the self conduction $E_i$ which is in the center of the forbidden band. The energy level $E_i$ serves as the reference level for all the other energy levels. It is therefore practical to identify the purely potential electrostatic energy $-e\psi$, which is specified only up to an additive constant with the curve of the energy level $E_i(E_i=-e\psi)$. The energy $e=E_F+e\psi$ then indicates the spatial concentration distribution of the mobile electrons and holes in the semiconductor region III. In a thermal balance, the concentration of the electrons in the conduction band for a non-degenerated semiconductor is $n=n_i$ to the exponent $e\phi/kT$ and the concentration of the defect-electrons in the valence band is $p=n_i$ to the exponent $-e\phi/kT$. The magnitude $n_i$ is the self-conduction density, $e$ is the elementary loading, $k$ is the Boltzmann constant and T is the absolute temperature.

If the Fermi level $E_F$ is above the energy level $E_i$, then the magnitude $e$ is positive. Obviously, the electron concentration $n$ will then be larger than the self-conduction concentration $n_i$ by a factor determined by the exponential function.

Figure 2:
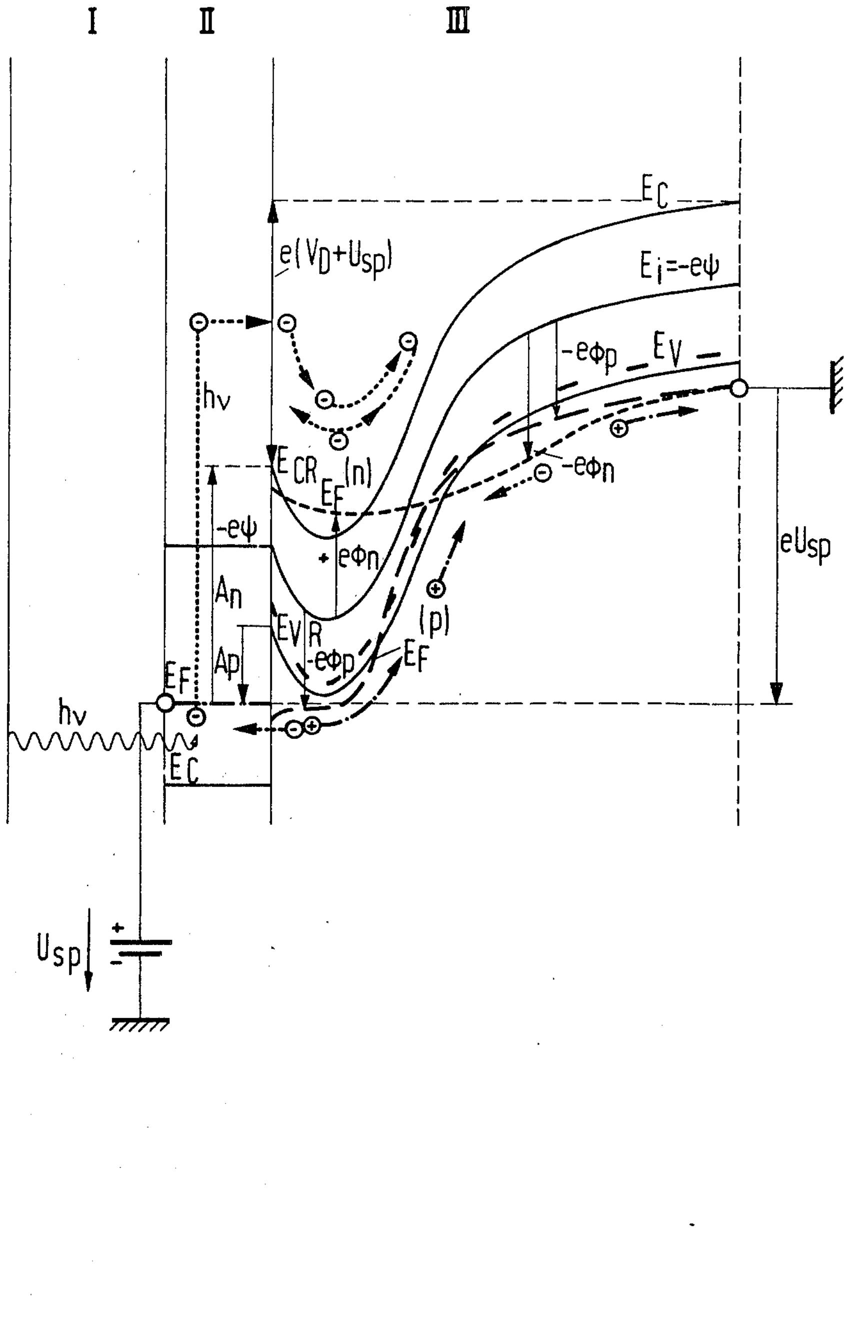
Figure 3:
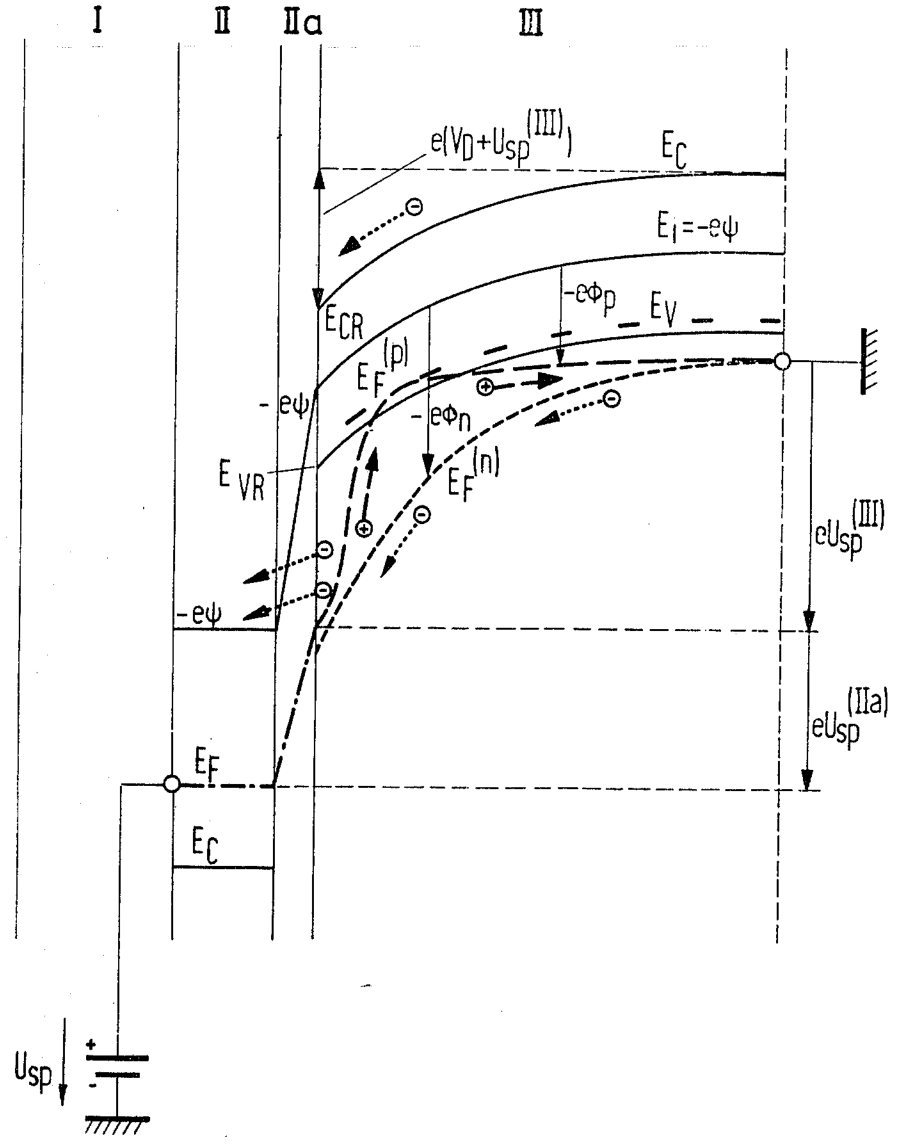
Figure 4:
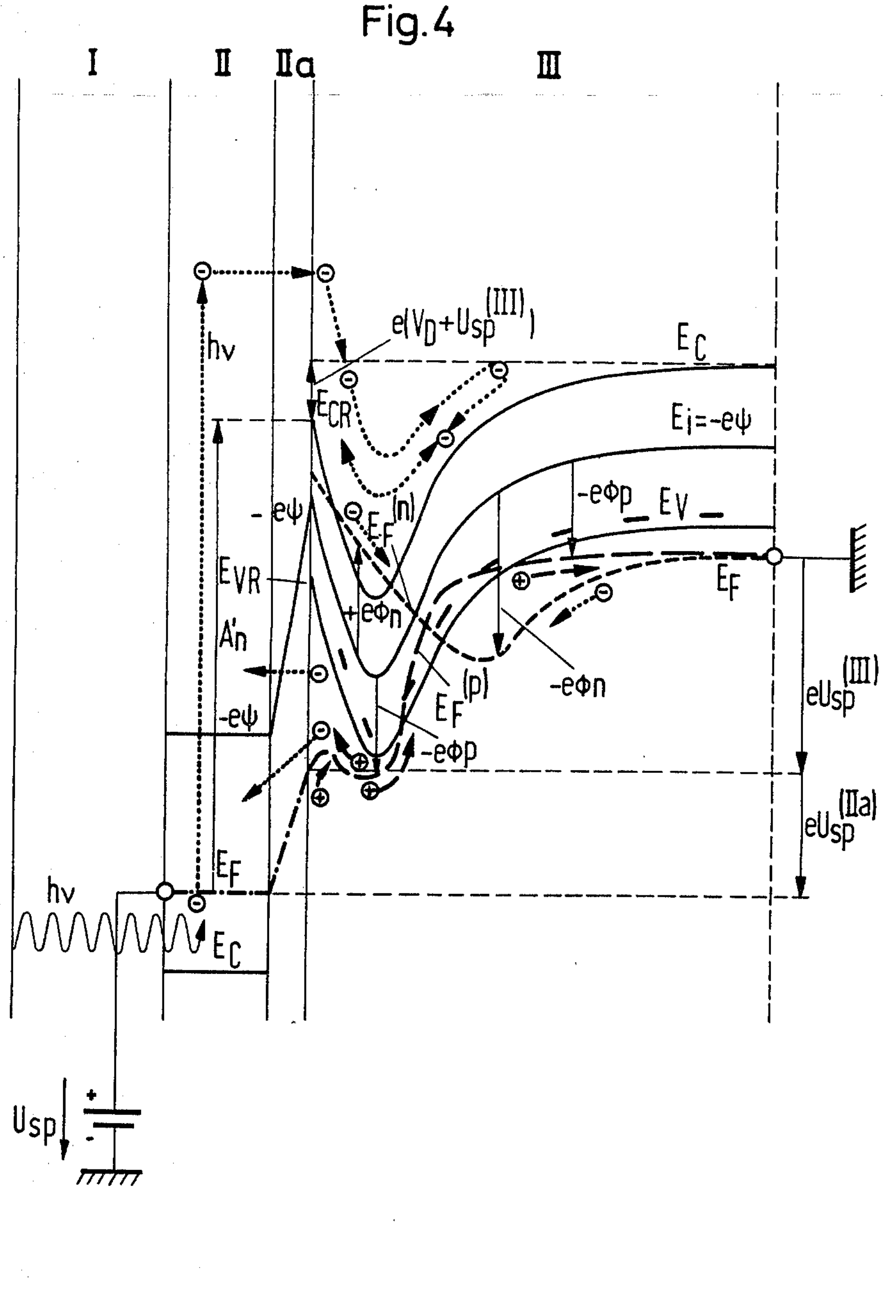

The aforementioned conditions are provided by material of $n$ conductivity type and the reverse conditions are provided by material of $p$ conductivity type. In this case, the Fermi level $E_F$ is below the energy level $E_i$ of self-conduction and the energy difference between $E_i$ and $E_F$ is, as seen in FIG. 1, to be assumed as negative. Therefore, in material of $p$ conductivity type, the energy $e\phi$ is negative in the foregoing exponential expressions. Hence, the defect-electron concentration is larger, by the exponential factor, than the self-conduction concentration. This fact is here noted, because the magnitude and positive or negative aspect of the energy difference $\epsilon\phi$ analogously determines the concentration of the mobile load carriers, even under unbalance conditions as indicated in FIGS. 2, 3 and 4.

Under unbalance conditions, the Fermi level $E_F$ splits into the electrochemical potentials $E_{Fn}$ and $E_{Fp}$ for electrons and defect-electrons and the appropriate levels or magnitudes $\epsilon\phi_n$ and $\epsilon\phi_p$ replace $\epsilon\phi$. The magnitudes or levels $\varphi_n$ and $\varphi_p$, which are usually called Quasi-Fermi potentials, are related to the electrostatistical potential $\psi$ and the potentials $\phi_n$ and $\phi_p$, preferred in order to maintain simplified drawings as $\varphi_n=\psi-\phi_n$ and $\varphi_p=\psi-\phi_p$. The potential $\phi$, as well as the poentials $\phi_n$ and $\phi_p$ deriving therefrom in an unbalanced condition, are functions of the horizontal length coordinate which is considered as increasing positively to the right from the left boundary of the semiconductor region III. This permits a one dimensional spatial description of the electronic conditions within the semiconductor regions. Similarly, the concentrations $n$ and $p$ of the mobile electrons and holes through the potentials $\phi$ and $\phi_n$ and $\phi_p$ are functions of the horizontal length coordinates whose variable value always indicates a specific depth within the semiconductor region.

In the example of FIG. 1, the Fermi level $E_F$ is obviously within the valence band, below its upper limit $E_V$.

This corresponds, in accordance with the prerequisite of a high $p$-doping of the semiconductor region III, to the range of statistic solidification. The dopant atoms levels of the acceptors are identified as equidistant lines above the upper level $E_V$ of the valence band. The defect-electron concentration within the semiconductor layer is determined in the quasi-neutral region by the number of dopant atoms. There, $p=p_H$ with a potential $\phi=\phi_H$. At the border or boundary between the metal layer II and the semiconductor region III, a marginal concentration $p=p_R$, which is generally solid and differs from $p_H$, is formed. The marginal concentration is determined by the work function $A_p$ of the defect-electrons issued or emitted from the metal layer into the semiconductor layer. This work function is the characteristic material for a specific contact.

In the example of FIG. 1, the marginal concentration $p_R$ is larger than the defect-electron concentration $p_H$ in the quasi-neutral interior of the semiconductor material. This results in a band bulge which causes a diffusion voltage $V_D$ to occur between the semiconductor interior and the left semiconductor border of the region III. The diffusion voltage $V_D$ compensates, at a thermal balance, the diffusion current resulting from the concentration drop or gradient with a field current. An electric space load appears in the transition region of the band deformation. In the example of FIG. 1, the space load region is a type of a defect-electron concentration layer. The length or thickness of the space load region may be assumed to be in the order of magnitude of $10^{-6}$ cm. due to the high concentration of defect-electrons. The length or thickness also corresponds, with respect to the order of magnitude, to the free path length of enriched electrons and defect-electrons, emitted from the metal layer II into the space load region of the semiconductor layer III. As a result, the characteristic electronic processes of my invention occur in the area of the semiconductor region which borders the metal layer II, which reaches a depth of about $10^{-6}$ to $10^{-5}$ cm.

To simplify the illustration of physical conditions in FIG. 1, the course of the potential electrostatic energy $-e\psi$ within the metal layer II is indicated by a horizontal line ,at the same level as the limit value of the self-conduction energy $E_i$. Such a course of the potential electrostatic energy does not usually occur at the junction or boundary between the metal and semiconductor layers. The typical realistic conditions are better approximated by assuming a variation in the curve of the potential electrostatic energy at the boundary of the metal and semiconductor layers, due to monomolecular intermediate layers. The variation in potential is physically independent of the magnitude of the diffusion voltage. In the electronic processes within the junction or border between the metal and semiconductor layers, the effects of the monomolecular double layers, as well as the effects of additional disturbance levels and traps, do not play an essential part. Since these effects may be modified by known technological processes and even widely suppressed by such processes as desired, they are ignored in the following electronic processes which are of primary interest in in the present disclosure.

The work functions of $An$ and $Ap$ for the enriched electrons and defect-electrons, which are emitted in the same direction from the metal layer II into the semiconductor region III are indicated by vertical lines in FIGS. 1, 2, 3 and 4 due to the opposite energy conditions of the two types of load carriers. This corresponds to the fact that in the energy diagram upon which FIGS. 1 to 4 are based, the electrons increase upward from below during an increase in energy, while at the occurrence, the defect-electrons sink downward from above. An electron which is to travel from the metal layer II into the conduction band of the semiconductor region III, must be raised from the energy level $E_F$ of the Fermi level at least to the energy of the bottom margin of the conduction band at the boundary between the metal and semiconductor layers. The arrow indicating the work function of the electrons thus points upward from the Fermi level $E_F$ and its arrowhead is at the marginal value of $E_{CR}$ of the lower limit of the conduction band.

The equation $A_n=E_{CR}-E_F=-\zeta(n_R/N_C)$ applies to the work function of the electrons. $\zeta$ is the chemical potential of the electrons as a function of the non-dimensional quantity $n_R/N_C$ determined in the semiconductor region III immediately before the boundary area of the metal layer II. The magnitude $n_R$ indicates a marginal concentration of the conduction electrons, independent of the position of the Fermi level and on the number of dopant atoms in the semiconductor. $N_C$ is the effective or actual constitutional density in the conduction band of the semiconductor region III. The functional relationship indicates the work function as a characteristic material quantity of the boundary or junction. Since according to a prerequisite, the region III is strongly of $p$ conductivity type, the value of the quantity $n_R/N_C$ remains small compared to one, so that the logarithmic limit law may be utilized to determine the Fermi integral $\zeta$ of the chemical potential.

The work function of the electrons is determined by the equation $A_n=E_{CR}-E_F=-kT\ln(n_R/N_C)$. The marginal concentration $n_R$ of the conduction electrons is connected with the diffusion voltage $V_D$ of the space load region and with the acceptor concentration $N_a=p_H$ of the semiconductor region III, through equation $n_R=(n_i^2N_a)$ to the exponent $(-eV_D/kT)$. These relationships indicate the work function as a characteristic material quantity of the boundary or junction.

If an electron is photoelectrically excited in the metal layer II at the Fermi level $E_F$ with an energy $E_a$ which is greater than the work function $A_n$ from the metal into the conduction band of the semiconductor, $E_a$ being greater than $A_n$, then if said electron has a motion component perpendicular to the metal area between the layers II and III, it enters the conduction band of the semiconductor region III as a "hot" electron, with a kinetic energy $E_{kin}=E_a-A_n=E_a-(E_{CR}-E_F)$. The term "hot" relates to the condition of many thus-excited electrons which upon entering the conduction band of the semiconductor as an enriched electron cloud represent an unbalance condition which is far removed from the thermodynamic balance and which is characterized by a plasma temperature of the hot electrons, which temperature may be considerably higher than the temperature of the crystal lattice.

Contrary to the issuance or emission of hot electrons from the metal layer II into the originally essentially unoccupied conduction band of the semiconductor region III, are the physical conditions during the issuance or emission of a hot defect-electron from the metal II into the valance band of the semiconductor region III, which semiconductor region has a statistically degenerated defect-electron enrichment layer. In this case, as a consequential development of the electron statistic in semiconductors and metals, the difference between the upper limit of the valence band and the Fermi level is to be defined at the junction, boundary or border surface between the layers II and III for the work function $A_p$ of the defect-electrons from the metal layer II into the semiconductor region III. That is, $$A_p=E_{VR}-E_F=\zeta(p_R/N_V)$$

In the definition of the work function of the defect-electrons from the metal layer II into the valence band of the semiconductor III, the marginal concentration $p_R$ of the defect-electrons obviously appears in the expression of the chemical potential $\zeta$ as a function of the non-dimensional quantity $p_R/N_V$.

Since the semiconductor region is doped as material of $p$ conductivity type up to the range of statistical degeneration, and since these conditions still prevail due to a correspondingly high marginal concentration $p_R$, even at the junction or boundary between the metal and semiconductor layers, $p_R$ is greater than $N_V$, where $N_V$ is the actual constitutional density of the valence band. The logarithmic limit law of the chemical potential in the range of non-degenerated carrier concentrations therefore cannot be used for defect-electrons, under the aforedescribed conditions.

The general equation $$A_n-A_p=E_{CR}-E_{VR}=E_g=-\zeta(n_R/N_C)-\zeta(p_R/N_V)$$

which is independent of specific boundary conditions, is derived from the two definitive equations for the work function $A_n$ and $A_p$ of electrons and defect-electrons issuing from the metal layer II into the statistically degenerated semiconductor region III.

It is known that the sum of the work functions of the electrons and the defect-electrons of a metal and semiconductor layer boundary or junction is equal to the width of the forbidden band of the semiconductor layer at said boundary or junction. The marginal concentration $p_R$ of the defect-electrons of the semiconductor region III is therefore determined in a thermal balance at the boundary or junction surface between the layers II and III by the marginal concentration $n_R$ of the electrons in the conduction band as well as by the width $E_g$ of the forbidden band and the effective or actual constitutional densities $N_C$ and $N_V$.

In a defect-electrons enrichment layer, $p_R$ is greater than $N_a$. As shown in FIG. 1, the band limits are then bent upward within the space load or space charge region. For the physical prerequisites of the present invention, the fact that $p_R$ is greater than $N_a$ is of less importance than the fact that $p_R$ is greater than $N_a$ which is greater than $N_V$. This means that the defect-electron concentration or enrichment of the semiconductor region III should be statistically degenerated at the semiconductor junction with the metal layer II.

The reason for the foregoing prerequisite which is derived from the present invention results from the fact that in a semiconductor with non-degenerated carrier concentration, the Fermi level is located somewhere within the forbidden band. In this case, both work functions $A_n$ and $A_p$ are positive. For the issuance or emission of a defect-electron from the metal into the valence band of the semiconductor, a positive value of $A_p$ means that during the process an electron must be raised equivalently at the junction or boundary of the metal and semiconductor layers from the upper limit of the valence band of the semiconductor up to the magnitude of the Fermi level in the metal. The defect-electron emitted from the metal into the semiconductor would thereby lose the corresponding energy.

If, on the other hand, during statistical degeneration of the defect-electron concentration, as assumed in the example of FIG. 1, the Fermi level extends within the valence band of the semiconductor region III, then, in accordance with the foregoing equation for the sum of the work functions of both carrier types, the work function $A_p$ for defect-electrons which are emitted or issued from the metal into the valence band of the semiconductor, is consequently negative.

In FIG. 1, therefore, the arrow direction of $A_p$ is opposed to that of $A_n$. Therefore, from a physical point of view, a defect-electron which is issued or emitted from the metal layer II into the valence band of the semiconductor layer III has at the commencement of its movement an average kinetic energy which corresponds to the energy minimum distance $A_p$ of the Fermi level from the upper limit of the valence band, whereby such kinetic energy represents a quantum-mechanical median value. As a result, when a blocking voltage is applied between the metal layer II and the degenerated semiconductor region III, an equivalent number of defect-electrons is emitted or issued from the metal layer II into the valence band of the semiconductor region III with the travel of electrons from the valence band into the metal layer. The defect-electrons transfer the high average kinetic energy which they receive in relation to the energy level of the valence band during their formation at the junction or boundary surface between the metal and semiconductor layers into the semiconductor layer. The kinetic energy is transferred up to a depth corresponding to the average free path length and thus represents a plasma flow of enriched defect-electrons in the space charge region of the semi-conductor layer. Due to the high defect-electron enrichment, the semiconductor layer has a thickness of the same order of magnitude as the aforementioned depth.

Under the conditions depicted in FIG. 1, of an enrichment of defect-electrons at the boundary or junction of the metal and semiconductor layers, the defect-electrons issued by the metal into the valence band of the semiconductor layer, start at an increased average kinetic energy compared to the quasi-neutral region. The defect-electrons travel, essentially without scattering processes, in the electric field of the blocking voltage through the space charge region. During their further travel in the quasi-neutral region the defect-electrons transmit, as majority carriers, their excess kinetic energy to the defect-electron plasma and to the crystal lattice, by relaxation processes. The enriched current of hot defects-electrons, created thereby in the crystal region adjacent the boundary or junction of the semiconductor, forms an electronic medium which, as hereinbefore explained, is energized to high-frequency oscillations by an electro-dynamic varying effect with the plasma of hot electrons which oscillates in the conduction band.

The just-described effect of enriched defect-electrons produced at the boundary or junction of the metal and semiconductor layers with an excess of average kinetic energy with respect to the degenerated defect-electron plasma within the semiconductor layer, may be intensified by placing a very thin, high-ohmic dielectric layer between the metal layer II and the degenerated semiconductor region III. This may, for example, be an oxide layer of the semiconductor or of the metal, but may also comprise a mixture of both oxides or oxides of other materials. When a blocking voltage is applied, a strong drop in potential of the Fermi level of the defect-electrons occurs from the semiconductor toward the metal. The intermediate dielectric layer should be so thin that at this point, due to the potential drop a large number of electrons break out, so to speak, from the valence band of the semiconductor at its junction or boundary with the intermediate layer by tunneling through the intermediary layer and pass into the metal layer II (FIG. 3). During this process, a correspondingly large number of defect-electrons are emitted into the valence band even with a median kinetic starting energy, which is considerably higher than the work function $A_p$ of the defect-electrons in FIG. 1.

With respect to communications technique, the foregoing teaching is of importance to the component of my invention Such teaching is that the aforedescribed physical effect in the semiconductor at the junction with the metal layer may produce an enriched defect-electron plasma whose defect-electrons are issued or emitted as hot defect-electrons with a relatively high starting energy into the valence band of the semiconductor. It is essential to this electronic process that during the formation of hot defect-eletcrons the electrons similarly remove from the valence band of the semiconductor pass directly into the metal layer and thus no longer play any part in the electronic processes within the semiconductor in excited conditions or in the conduction band. The formation of hot defect-electrons at the junction or boundary of the metal and semiconductor layers thus represents a controllable electronic operation which affects the semiconductor internally by external conditions. The operation is not compensated by a simultaneous production of conduction electrons within the semiconductor.

The complete electronic processes upon which the invention is based may be better understood by noting that in an analogous manner the hot electrons emitted from the metal into the conduction band of the semiconductor perform an automatically controlled electronic operation. The source of the electronic operation does not depend upon the production of hot defect-electrons, but it is this circumstance which substantiates with respect to communications technique the function of an active four-pole component or circuit of an electrodynamic varying effect with the flow of hot defect-electrons issued or emitted into the valence band during a subsequent phase of the electronic processes.

This process is not called an injection, but an emission of hot defect-electrons from the metal layer II into the semiconductor region III, in order to express the physical differences as compared to a conventional carrier injection which is produced by a small deflection or deviation of thermal balance. In contrast, in the present electronic process, particularly when there is a very thin, high-ohmic intermediate dielectric layer between the metal layer II and the semiconductor layer III, the valence electrons, which are raised above the Fermi level in the metal layer by blocking voltage, escape from the valence band of the semiconductor into the impoverished internal area of the metal. The escape of the valence electrons similarly produces a high-grade unbalance distribution of hot defect-electrons with respect to the lower regions of the semiconductor, in the region of the semiconductor adjacent the junction or border.

The load carriers are drawn into the semiconductor in the electric field of the applied blocking voltage. Due to the excess of defect-electrons with a relatively high average kinetic energy, this produces a plasma flow of hot electrons in the vicinity of the semiconductor boundary within the spatial extension of an average free path length. The plasma flow is controlled by an electromagnetic varying effect with the high-frequency oscillations of the hot electrons in the conduction band. The fact that the oscillation period of the hot electrons issuing from the metal layer into the conduction band of the semiconductor layer is comparable to the relaxation period of the enriched defect-electron flow, or that said oscillation period may be maintained essentially smaller than the relaxation period when external conditions are appropriately adjusted, creates the interesting possibility, with regard to communications, of amplifying as well as modulating the high-frequency oscillations obtained.

A blocking voltage may be applied between the metal layer II and the semiconductor region III, as well as during simultaneous photoelectric excitation and emission or issuance of hot electrons from the metal layer II into the conduction band of the semiconductor layer III. FIG. 2 illustrates the energy structure of the electronic processes occurring between the metal layer II and the semiconductor region III when a blocking voltage is applied. Although FIG. 2 discloses, with regard to quality, essentially only an instantaneous reproduction of the time variable electronic processes, it graphically discloses the characteristic features of the electronic processes upon which the present invention is based from the viewpoint of physical and communications technique.

The flow or travel of hot electrons issued or emitted from the metal layer II into the conduction band of the statistically degenerated semiconductor region III of *p* conductivity type originates from photoelectric excitation within the metal layer II. It is of fundamental importance that the source of hot electrons does not depend on the production of the plasma of enriched defect-electrons, hereinbefore described. This determines the active properties, with respect to the communications techuique, of the electromagnetic varying effect between both enriched collective carriers. The field or range of extremely high frequencies or communications technique requires photoelectric excitation provided by optical transmission, as well as the issuance or emission of hot electrons which is important due to its lack of inertia.

The photoelectric excitation of hot electrons in the metal layer II may result from fluorescent radiation produced by and issuing from the medium I which is positioned ahead of the metal layer II. The medium I may comprise, for example, a crystal. An electromagnetic beam within the optical spectral region is self-produced in the crystal region I in a conventional manner. The optical radiation provided by the crystal region I has a quantum energy required for photoelectric excitation in the metal layer II and sufficient intensity for the desired issuance or emission of hot electrons. The radiation may be produced by an external light source. The electromagnetic beam is then stored in the usual manner so that the beam from the crystal region I penetrates into the metal layer II. Since there are a great number of ways to produce the optical radiation required for photoelectric excitation of the metal layer II, no other details are shown in the FIGURES in the region I than a symbol for the radiation penetrating said metal layer II with a quantum energy *h*.

Favorable physical conditions for communication technology require that the photoelectric excitation of the hot electrons in the metal layer II be produced by a coherent monochromatic light and that the thickness of said metal layer complies with the specified conditions for a given material. Furthermore, the condition required for the electronic operations illustrated in FIG. 2 is that the coherent electromagnetic radiation used to excite the hot electrons be completely absorbed within the metal layer II so that no photo-effect such as, for example, the formation of pairs of electron holes or excitation from disturbances or dopant atom levels, can occur in the adjacent statistically degenerated semiconductor region III.

The photoelectric excitation provided in the metal layer II may be caused, for example, by a dosed laser beam, issued from the crystal region I, which in such case is laser-active and electronically controllable. The dosing medium positioned between the crystal region I and the metal layer II which doses the laser beam is not shown in FIG. 2. The dosing medium functions to measure the radiation for photoelectric excitation in the metal layer II in the desired manner and to protect the metal layer II against damage by excessively high laser intensities.

The dosing medium may assist essentially in the removal of heat produced in the metal layer II due to the absorption of the radiation. In special instances, the dosing medium provided between the crystal region I and the metal layer II may comprise an optical non-linear substance. The frequency of the laser beam is increased in the non-linear substance of the dosing medium by a production of harmonics of the laser frequency, which laser frequency is radiated as a fundamental frequency. Due to energy considerations, a harmonic is preferably utilized in the metal layer II for the photoelectric excitation of the hot electrons.

The advantage of photoelectric excitation of the plasma of hot electrons is, aside from the lack of inertia in the process, that the excitation may be controlled with respect to the intensity of the radiation utilized. Basically, the frequency of the optical radiation or optical beam which produces the hot electrons may also be modulated in a conventional manner. It is particularly important, however, that the concentration of the hot electrons produced by photoelectric excitation be variable up to the range of statistical degeneration due to the high intensity of the excitation radiation.

The basically variable excitation energy of the photons which photoeletcrically produce the hot electrons must always be so selected that due to their high total energy within the metal layer relative to the Fermi level the photoelectrons are issued or emitted as hot electrons from the metal layer II directly into the conduction band of the semiconductor region III of *p* conductivity type. Due to the aforedescribed excitation conditions, the concentration of the hot electrons issued or emitted into the conduction band of the semiconductor region III is variable and may be controlled in the statistical degeneration range up to a value comparable in its order of magnitude to the enrichment or concentration of the defect-electron plasma.

The concentration of the hot electrons in the conduction band of the semiconductor is determined by a plurality of coacting influences. Such influences include the concentration and average energy of the reserve of hot electrons produced photoelectrically in the metal layer II, the work function of the excited electrons issued from the metal layer II into the conduction band of the semiconductor III, the variable voltage applied between the metal layer II and the semiconductor region III for driving the hot electrons issued or emitted into the conduction band of the semiconductor III back to the metal layer II, and the electrodynamic varying effect of the hot electrons which causes a return travel in the conduction band of the semiconductor by the flow of enriched defect-electrons in the valence band of the semiconductor region III.

A characteristic feature of the electronic process upon which my invention is based is the simultaneous emission or issuance of enriched defect-electrons and hot electrons from the metal layer II into the semiconductor region III of *p* conductivity type. This electronic process is not a physical contradiction under the special conditions of my invention, since the two emitted collective carriers issue from two different and independent sources. The sources, however, originate in the metal layer II and at the junction or boundary surface between the metal and semiconductor layers.

FIG. 2 discloses the travel of the defect-electrons in the semiconductor region III of *p* conductivity type. When the blocking voltage is $U_{sp}$, the forbidden band of the semiconductor layer III, ignoring the influence of the hot electrons issued or emitted into the conduction band, continuously bends downward within the space charge region, together with the quasi Fermi level $E_F^{(p)}$ of the defect-electrons, in the direction of the metal layer II. The quasi Fermi level $E_F^{(p)}$ of the defect-electrons is indicated by a broken line curve of long segments and the quasi Fermi level of the electrons $E_F^{(n)}$ is indicated by a broken line curve of shorter segments and smaller spaces. The curves of the two quasi Fermi levels $E_F^{(n)}$ and $E_F^{(p)}$ are considerably different from each other during strong deviations from the thermal balance. The two quasi Fermi level curves are shown in FIG. 2 with the applied blocking voltage and take into consideration the electrochemical forces and the recombination and pairing processes. The right boundary of the semiconductor region III in FIG. 2 does not have to correspond to the actual boundary of the semiconductor. The quasi-neutral semiconductor region is not essential to the electronic processes now discussed.

FIG. 2 illustrates primarily only the semiconductor region adjacent the metal layer II of the entire semiconductor layer of *p* conductivity type. The semiconductor region shown in FIG. 2 has space charges and deviates strongly from the thermal balance, and the electronic effect exerted on the enriched defect-electrons by the hot electrons emitted into the conductance band occurs in said semiconductor region. The quasi Fermi level $E_F^{(p)}$ extends essentially below the upper limit $E_v$ of the valence band, due to the high *p*-doping of the semiconductor region. The enrichment or concentration of the defect-electrons in such areas corresponds to values in the range of statistical degeneration.

In the steep portion of the band deformation, the quasi Fermi level $E_F^{(p)}$ of the defect-electrons is raised somewhat above the upper limit $E_v$ of the valence band.

This results from a relative reduction of the number of defect-electrons, since at this point the electrochemical driving force affecting the defect-electrons is strongest at the blocking voltage and the defect-electrons are drawn within the semiconductor at corresponding velocities. Just before the boundary or junction area of the metal and semiconductor layers, the quasi Fermi level $E_F^{(p)}$ of the defect-electrons declines most strongly below the level $E_v$ of the upper limit of the valence band, since an accumulation of enriched defect-electrons first occurs in said boundary region through the travel of electrons of the valence band of the semiconductor region III into the metal layer II.

The physical features of the foregoing process effected by the defect-electrons may be described in detail, as follows. Defect-electrons are issued from the metal layer II into the valence band of the degenerated semiconductor region III in the electric field of the applied blocking voltage $U_{sp}$. The relatively high kinetic energy of the defect-electrons is usually determined by the magnitude of a wave vector closely corresponding to the energy level of the quasi Fermi level $E_F^{(p)}$ of the defect-electrons in the vicinity of the boundary or junction area of the metal and semiconductor layers in the valence band of the semiconductor region III.

Due to the withdrawal of electrons from the upper energy limit of the valence band of the semiconductor region III to the range of statistical degeneration, the defect-electrons newly occurring due to the forced travel of the valence electrons of the semiconductor region III into the metal layer II commence at the junction or boundary of the metal and semiconductor layers at a relatively high kinetic energy corresponding to the level of the quasi Fermi level $E_F^{(p)}$ in the valence band of the semiconductor III. When the blocking voltage $U_{sp}$ is applied, the enriched defect-electrons flow as a particle current from the junction or boundary of the metal and semiconductor layers through the space charge region and into the internal area of the semiconductor region III.

The travel of the defect-electrons in the valence band of the semiconductor region III is indicated in FIG. 2 by plus signs in circles and broken arrows of dots and dashes. The arrows indicate the direction of travel of the defect-electrons which move upward at the incline of the quasi Fermi level $E_F^{(p)}$. The travel process of electrons in the valence band and in the conduction band of the semiconductor region III, discussed hereinafter in greater detail, is analogously indicated by minus signs in circles and broken arrows of dots which indicate the direction of travel of the electrons. From the plus and minus signs and the magnitude of the spatially variable energy difference $-e\phi_p$, $-e\phi_n$ and $+e\phi_n$ between the potential electrostatic energy $E_i=-e\psi$ and the quasi Fermi level $E_F^{(p)}$ and $E_F^{(n)}$, the non-balance enrichment or concentration distributions of the defect-electrons and the electrons within the semiconductor region III are derived.

The production of the enriched defect-electrons at the junction or boundary of the metal and semiconductor layers is controlled by the applied blocking voltage and by the hot electrons emitted into the conduction band of the semiconductor region III. Obviously, as shown in FIG. 3, the production of enriched defect-electrons may be greatly improved, however, by a considerable increase in the travel probability of the valence electrons of the semiconductor region III into the metal layer II when a blocking voltage is applied by additionally decreasing the electron energy within a high-ohmic intermediate layer II*a* in the direction from the layer III to the layer II.

As hereinbefore stated, simultaneously with the production and the travel of the enriched defect-electrons through the semiconductor region III, an additional issuance or emission of hot electrons from the metal layer II into the conduction band of the semiconductor layer III occurs.

The partial electronic process is described in greater detail as follows. The electron issuance or emission occurs due to photoelectric excitation of the conduction electrons of the metal layer II. This is indicated in FIG. 2 by the quantum energy $h\nu$ of the absorbed radiation and an appropriate increase in energy of the electrons, shown by dotted lines. The optical radiation may be provided, for example, by a laser-active crystal region I, positioned ahead of the metal layer II, and is therefore radiated into said metal layer from the surface of said layer opposite that at the junction or boundary between said metal layer and the semiconductor region III.

The following conditions are produced in the metal layer II by the foregoing conditions. The excitation radiation must be fully absorbed in the metal layer II, so that the semiconductor region III remains free from excitation and such radiation therefore cannot directly cause any photoeffects in said region III. On the other hand, the metal of the layer II must be appropriately selected and must have a thickness sufficient to damp the travel or movement of the hot electrons. The movement of the hot electrons is damped and absorbed in the metal layer II so that said electrons may be enriched during the photoelectric excitation with undampened hot electrons which issued from the internal area of said metal layer.

The hot electrons reach the metal surface at its junction or boundary with the semiconductor III with an average high kinetic energy without previously reaching a thermodynamic balance condition with the crystal lattice due to relaxation effects. Under these circumstances, the hot electrons produced by photoelectric excitation within the metal layer II overcome with sufficiently high quantum energy $h\nu$ the threshold of the electron work function $A_n$ and penetrate, due to their median kinetic energy and without the force effect of an external electric field, the conduction band of the semiconductor layer III up to a specific depth in the order of magnitude of the free path length.

The average kinetic energy of the plasma of hot electrons emitted from the metal layer II into the conduction band of the semiconductor III is approximately derived from the energy difference between the photoelectric excitation energy within the metal layer II and the work function of the electrons from the metal into the conduction band of said semiconductor III. The concentration of the emitted hot electrons is determined on the other hand, at a fixed, rigidly maintained electron work function and at a specified thickness of the metal layer II, essentially by the effective quantum utilization and the damping length of the hot electrons in the material of said metal layer II, as well as by the intensity of the excitation radiation. The damping length for a specific material of substance may be determined either experimentally or theoretically and results from the electron-photon and the electron-electron varying effect of the photoelectrically excited electron plasma in the metal layer and is, usually, in the order of magnitude of several $10^{-6}$ cm.

The following physical conditions are important, in communications technology, for the travel progress of the hot electrons from the metal layer II which penetrate the semiconductor layer III of *p* conductivity type. The photoelectric excitation of the electrons within the metal layer II, which is realized in accordance with a special embodiment of the present invention by a coherent essentially monochromatic laser beam dosed with regard to intensity, has a small velocity distribution of the emitted or issued photons compared to a normal photoeffect when the metal layer has a thickness which does not exceed the damping length of the hot electrons. Under these special conditions, the hot electrons emitted or issued into the conduction band of the semiconductor layer III produce, at the commencement of the travel process, an electron flow which constitutes a collective movement controlled by phase correlation up to a specific depth of penetration in the order of magnitude of several free path lengths. The phase correlations correspond approximately to the spatial and time coherence structure of the radiation which excites the electrons in the metal layer II.

The foregoing physical circumstances create the possibility in communications technology of transmitting a modulation of the dosed laser beam essentially free from inertia and in essentially proper phase relation with the flow of hot electrons produced photoelectrically by said laser beam and emitted or issued from the metal layer II into the conduction band of the semiconductor layer III.

The travel or movement of the electrons issued or emitted from the metal layer II into the conduction band of the semiconductor layer III is determined by the electric field of the applied blocking voltage, by the spatial concentration distribution of the electrons, by recombination and pairing processes, and by the varying effect of the hot electrons on the photons of the crystal lattice and on the defect-electron plasma.

When blocking voltage $U_{sp}$ is applied to the junction or boundary between the metal and semiconductor layers, the travel or movement and the time-varying concentration distribution of the hot electrons issued or emitted into the conduction band of the semiconductor III is derived (in FIG. 2) from the path of the curve, which indicates quality, of the quasi Fermi level $E_F^{(n)}$. The electrochemical forces affecting the electrons are always derived, considering the commencement condition of the travel or movement caused by the issuance or emission and the blocking voltage, from the slope of the quasi Fermi level $E_F^{(n)}$ in the semiconductor region III.

In FIG. 2, the path of the curve $E_F^{(n)}$ in the semiconductor region III indicates that on the right side in the internal area of the semiconductor the quasi Fermi levels $E_F^{(n)}$ and $E_F^{(p)}$ of electrons and defect-electrons differ only slightly from each other. Within this spatial range of the semiconductor, the deviation from the thermal balance is relatively small. When the space charge region is approached from the right side, a considerable split apparently occurs between the two quasi Fermi levels of the electrons and defect-electrons or holes, where initially the quasi Fermi level $E_F^{(n)}$ of the electrons proceeds at a lower energy than that of the defect-electrons, with a tendency to decrease to the left at the space charge region.

The thermodynamic factor is characteristic of the electronic conditions in the semiconductor region III when the blocking voltage is applied. Under such conditions, the electrons are drawn by the driving forces from the semiconductor region III in the form of minority carriers and therefore travel or move within that spatial area from right to left in a direction toward the metal layer II. The applied blocking voltage $U_{sp}$ would maintain the aforementioned electronic conditions up to the boundary or junction area between the metal layer II and the space charge region of the semiconductor layer III, were it not for the issuance or emission of hot electrons from the metal layer II into the conduction band of the semiconductor layer III. The hot electrons produce a strong disturbance in the electronic condition which prevails when the blocking voltage is applied.

Due to the emission of hot electrons, the quasi Fermi level $E_F^{(n)}$ of the electrons in the disturbed space-charged marginal region of the semiconductor layer III crosses the quasi Fermi levels $E_F^{(p)}$ of the defect-electrons as well as the bulging limits of the forbidden band. The quasi Fermi level $E_F^{(n)}$ extends with a concentration which compares to an enrichment of degenerated defect-electrons issued or emitted from the metal layer II to the marginal layer of the semiconductor layer III and extends partly within the conduction band, across the lower limit $E_C$.

The hot electrons issued or emitted from the metal layer II into the conduction band of the semiconductor region III of strong *p* conductivity type in the same direction as the defect-electrons in the valence band therefore travel, due to their high kinetic starting energy, against the electric field of the applied blocking voltage and finally reverse their direction of travel or movement. The penetration depth of the hot electrons advancing toward the electric field is variable in accordance with the blocking voltage at a specific rigidly maintained kinetic starting energy. The penetration depth is within the order of magnitude of the free path length of the hot electrons and is thus comparable to the thickness of the space charge region of the semiconductor region III and is approximately $10^{-6}$ to $10^{-5}$ cm.

As shown in FIG. 2 by a dotted line indication of the path of a representative electron in the conductance band, due to the advancing or starting and reverse or return travel or movement in the opposite field, a time-variable collection of hot electrons is formed ahead of the metal layer II in the semiconductor region III within the aforementioned depth of penetration. The hot electrons are distributed by a potential deformation produced by the electrons' own space charge which modifies the electrostatic potential difference or drop produced by the blocking voltage. At a sufficiently high concentration of the issued or emitted electrons, the fluctuating deformation of potential may, on the average, even assume a specific type of configuration.

This type of average electronic condition is schematically shown in FIG. 2. The electron cloud is usually compressed in the space or area of the specifically shaped potential deformation of the potential difference or drop. The space charge density and spatial configuration of the electron cloud are determined by the issuance or emission and return or reverse travel or movement of the hot electrons and the losses caused by recombination processes. The electron cloud represents an oscillatory electronic system which may be sensitively controlled externally by photoelectric excitation of the electron issuance or emission or by the blocking voltage.

The recombination of electrons must be kept sufficiently small in the crystal region in order to permit the formation of a fluctuating localized electron cloud from the self-reversing emission current of hot electrons. The semiconductor region III should thus be produced of monocrystalline semiconductor material as free from disturbances as possible and should have a low concentration of recombination centers. This requirement is particularly applicable to the boundary or junction area between the metal layer II and the semiconductor region III.

The oscillation frequencies in the electron cloud and the intensity of the electron cloud are variable via the electron emission and the blocking voltage. The oscillatory system of the electron cloud fluctuates relative to the time average between the metal layer II and the electrostatic potential difference or drop of the applied blocking voltage. The electron cloud of travelling hot electrons issuing from the metal layer II and reversing in the opposing electric field may produce high frequency self-oscillations and forced, damped oscillations. The self-oscillations result from the collective behavior of the electron cloud caused by the coulomb varying effect of the electrons which permits an essential control of travel or movement by phase correlation as compared to the uncontrolled thermal scattering of the electrons.

The self-frequency of the oscillatory electron cloud may be produced or excited by the hot electrons issued or emitted from the metal layer. This is because the electrons issue or travel into the electron cloud, due to the photoelectric excitation in the metal layer in its boundary region with the semiconductor region III which has a magnitude of several median free path lengths of the electrons, at primary velocities which may be much higher than the average saturation drift velocity of hot electrons in a semiconductor.

In order to provide a simplified estimation of the orders of magnitude, it is assumed that said marginal or border region of the produced electrons has a thickness of $10^{-6}$ to $10^{-5}$ cm. Frequencies in the range of $10^{12}$ to $10^{13}$ hertz may then be derived for the hot electrons emitted from the metal layer II. The hot electrons oscillate in damped condition with decaying amplitudes in the marginal or border region at an average velocity in the order of magnitude of $10^{7}$ cm./sec. The inherent plasma frequencies of the electron cloud have the same order of magnitude as the aforementioned frequencies of $10^{12}$ to $10^{13}$ hertz at electron densities of about $10^{16}$ to $10^{17}$. The electron densities of about $10^{16}$ to $10^{17}$ are the mean value over the entire expanse of the electron cloud. The forced oscillations of the electron cloud, brought about either by an appropriate modulation of the electron issuance or emission or by oscillations of the applied blocking voltage, may have any desired frequencies.

The frequencies of the electron cloud may be in the range of microwaves, particularly when conventional means of excitation and transmission are utilized. The frequency range may be, for example, between $10^{11}$ and $10^{12}$ hertz. At a sufficient difference in the order of magnitude of the frequencies, the forced oscillations of the electron system may be in the range of centimeter waves in communication technology and when used as signal frequencies, for example, whereas the inherent frequencies may be in the range of sub-millimeter waves when used as carrier frequencies. This range is not readily accessible in conventional microwave technology.

Amplification of the signal oscillations or of a regenerative amplification of self-oscillations may be accomplished only by the automatically occurring electromagnetic varying effect between the controllable oscillating plasma of hot electrons in the conduction band of the semiconductor region III and the plasma of enriched defect-electrons issuing from the metal layer II and traveling in the valence band with a translatory movement via said semiconductor region III. The electromagnetic varying effect between the two collective carriers of hot electrons and enriched defect-electrons with essentially comparable concentrations produces an internal feedback.

The essentially inertia-free and phase-correct amplification of a signal frequency in the ultrahigh frequency range results from the aforedescribed synchronous double emission of enriched electrons and defect-electrons from the metal layer II into the marginal region of the semiconductor III with a varying reduction of the partial space charge limitation of the partial emission currents. A signal variation or oscillation of the electron cloud in the conduction band of the semiconductor produces a simultaneous modulation of an amplified defect-electron emission which is again imposed upon the oscillation of the electron cloud. Depending upon the energy conditions at a selected working point between the median input and output energy and considering the losses due to damping effects and recombination processes, the electronic process of amplifying an impressed signal or of self-oscillation may produce ultrahigh frequency generation.

The aforedescribed electronic processes and conditions may be varied in many respects. Furthermore, I have made two different and special further developments which result in broadening the electronic characteristics or properties from a technical and physical point of view. An explicit and detailed description of the modified electronic conditions is superfluous, however, since they are self-evident in view of the foregoing explanations.

FIG. 1 shows the metal semiconductor layer in unloaded thermal balance condition. The semiconductor region III is uniformly doped up to the range of statistical degeneration and obviously has a simple non-inverted defect-electron concentration layer with a correspondingly strongly degenerated marginal enrichment or concentration of defect-electrons near its boundary or junction with the metal layer II. The variation of the electronic condition or structure in the thermal balance is due to the fact that the enrichment layer is maintained with a defect-electron marginal concentration in the range of statistical degeneration, as shown in FIG. 1, so that the space charge region represents a spatial range of statistical degeneration.

Outside the space charge region, however, a non-degenerated semiconductor region of $p$ conductivity type exists in the quasi-neutral semiconductor region. Thus, the semiconductor region III does not have to be doped with acceptors up to the statistical degenerator range if only the condition of statistical degeneration is ensured for the defect-electrons by a sufficiently high marginal concentration in the defect-electron enrichment layer provided with space charges.

The specialization of electronic conditions has the advantage that a degenerated defect-electron plasma is maintained by the space charge region of the semiconductor region III (FIG. 1). When blocking voltage is applied to the junction or boundary between the metal and semiconductor layers, enriched electrons are issued or emitted from the metal layer II with a quasi pulse approximately corresponding to the magnitude of the quasi Fermi level. The relatively high-ohmic quasi-neutral crystal interior, which is beyond the reach of the hot electrons issued from the metal layer II into the semiconductor layer III and of defect-electrons, has electrical characteristics which may selectively differ considerably from those of the defect-electron concentration layer.

For electromagnetic ultrahigh frequency waves which may occur or be amplified in the oscillation range of hot electron-defect-electron plasma in the marginal space charge region, the interior of the quasi-neutral crystal of the semiconductor layer III represents, in the circumstances, a region of normal scattering or dispersions. Thus, expansion or radiation of the electromagnetic waves is achievable with essentially no losses by utilizing considerably larger crystal zones than those permitted by the space charge region of the semiconductor layer III. This factor is of technical importance, since it permits an electromagnetic conversion of the short-wave oscillations within the narrow space charge region adjacent the metal layer II of approximately $10^{-5}$ cm. into more convenient dimensions of the semiconductor, with respect to order of magnitude or into another medium adjacent thereto. The adjacent medium may also be a vacuum, for example.

Due to the aforementioned reasons, the semiconductor region III will under specific conditions not have homogeneous doping, as in FIGS. 1 and 2, but will, preferably, have considerably inhomogeneous doping, whereas the interior of the crystal may be relatively high-ohmic.

In order to provide a statistically degenerated non-inverted defect-electron enrichment layer through an appropriately high marginal concentration of the defect-electrons, it must be considered that in simple junction or boundary areas between the metal and the semiconductor layers the marginal concentration of the defect-electrons is determined by the work function of the defect-electrons issued or emitted from the metal layer into the semiconductor layer. The border concentration thus constitutes a characteristic magnitude of both the metal and the semiconductor materials which hardly depends upon the doping.

The limitation caused by the material properties of the crystal lattice of the metal layer II and the semiconductor III may be eliminated by artificially producing the desired high marginal concentration of defect-electrons at an arbitrarily selected magnitude by providing an acceptor-like surface coating of foreign atoms in the boundary area between said metal layer II and said semiconductor region III. This area doping may be precipitated upon the semiconductor surface from a gas atmosphere, for example, prior to the vapor deposition of the thin metal layer II upon the semiconductor layer III.

The dopant surface coating with acceptors which partly diffuse somewhat into the semiconductor layer III produces a strong doping gradient in the region adjacent the border and this produces the desired high *p* conductivity in a defect-electron enrichment layer during a condition of thermal balance. Although, in this case, the defect-electron enrichment or concentration layer is not provided by the nature of the crystal lattices of the adjacent metal and semiconductor layers, but by a strongly inhomogeneous acceptor border doping, this is not essential to the aforedescribed electronic oscillation processes within the enrichment layer of the defect-electrons.

Other electronic conditions are illustrated in FIGS. 3 and 4, where a very thin and high-ohmic intermediate layed II*a* is provided between the metal layer II and the semiconductor region III. The thickness of the intermediate layer II*a* is in the order of magnitude of 10 A. The intermediate layer II*a* may comprise an insulator or a semiconductor material with essentially self-conducting properties such as, for example, an oxide layer. The ohmic-intermediate layer II*a* is precipitated as a thin metallic film from a chemically inactive gas which carries the molecular components of the material to be precipitated upon the semiconductor surface prior to the process of applying the metal layer II. The intermediate layer may also be produced by vapor deposition. If an oxide layer is preferred as the intermediate layer, it may be prepared, preferably, by thermal oxidation.

FIG. 3 qualitatively shows the electronic conditions at a blocking voltage $U_{sp}$ applied between the metal layer II and the semiconductor region III without photoelectric excitation of hot electrons in the metal layer II. The blocking voltage is divided into a voltage drop $U_{sp}^{(III)}$ in the semiconductor region III and a voltage drop $U_{sp}^{(IIa)}$ in the high-ohmic intermediate layer II*a*. The steep drop of the statistic energy within II*a* and the Fermi level combines both branches of the electrochemical energy split up in the semiconductor region III, as schematically shown in FIG. 3.

The intended electronic effect of the intermediate layer II*a* is due only to the phenomenon that the valence electrons at the edge of the semiconductor region III in the vicinity of the quasi Fermi level $E_F^{(p)}$, which level curves downwardly when a blocking voltage or load is applied, will be issued or emitted with increased probability from the valence band of said semiconductor region III into the metal layer II because of the strong electrical field within said intermediate layer II*a*. The valence electrons then pass through the intermediate layer II*a* either by the tunnel effect or by high field emission, depending upon the thickness of the intermediate layer II*a* and the steepness of its potential slope $U_{sp}^{(IIa)}$.

As a consequence of this purpose, a defect-electron or hole of high kinetic energy is newly generated at the border of the semiconductor layer III for each of these valence electrons entering into the metal layer II. The electrochemical forces then draw the defect-electron upwardly along the ascending slope of the quasi Fermi level $E_F^{(p)}$ of the defect-electrons. Consequently, the intermediate layer II*a* causes the applied blocking voltage to produce at the border of the semiconductor region III an increased crowding of enriched defect-electrons which are emitted as hot electrons into said semiconductor region III. The effect of the production and emission of hot defect-electrons, however, is considerably more intensive than in the electronic condition illustrated in FIG. 2, due to the aforedescribed functioning of the intermediate layer II*a*, which is not included in FIG. 2. This physical behavior determines the technological purpose of the intermediate layer II*a*.

A qualitative discussion of the motion and concentration distribution of the mobile charge carriers in the statistically degenerated semiconductor region III of *p* conductivity type when a blocking voltage is applied to the metal and semiconductor layers, is as follows. These physical data are indicated by the paths of the two quasi Fermi levels $E_F^{(p)}$ and $E_F^{(n)}$ of the defect-electrons and the conductance electrons, respectively. In FIG. 1, with a defect-electron crowded layer, the limits of the forbidden band are curved upwardly at thermal equilibrium and no external load. The curve $E_i=e\psi$ of the electrostatic potential energy is curved in a similar manner. With a sufficiently large external blocking voltage these curves become bent in the direction toward the junction or boundary surface as shown in FIG. 3.

The depth of the space charge region, which extends under a blocking load into the semiconductor region III, coincides with the depth of the space region of the band curvature. The two quasi Fermi levels also curve downwardly in the same sense. The quasi Fermi level of the conductance electrons extends to a greater depth than that of the defect-electrons. This is characteristic for the blocking condition. This corresponds to an extraction of the conductance electrons in the semiconductor region III from the border region in the electrical field of the blocking voltage with a simultaneous emission of defect-electrons in the opposite direction from the junction or boundary surface into the interior of the semiconductor region.

Under the electronic conditions illustrated in FIG. 3, as opposed to FIGS. 1 and 2, the border concentration of the defect-electrons no longer remains constant, but increases coincidentally with the voltage drop of the blocking voltage. Part of the blocking voltage decreases in the intermediate layer II*a*. This is due to the number of electrons increasing with blocking voltage and passing at the junction or boundary surface from the valence band of the semiconductor layer III through the intermediate layer II*a* into the metal layer II.

The distance of the quasi Fermi level $E_F^{(p)}$ of the defect electrons from the upper limit of the valence band is therefore larger at the border of the semiconductor region (FIG. 3) than in FIGS. 1 and 2. This results from an increase in the production of enriched defect-electrons at the border of the semiconductor region III caused by the blocking voltage as compared with a component which does not include an intermediate layer II*a*. The quasi Fermi level $E_F^{(p)}$ of the defect-electrons in FIG. 3 in the vicinity of the semiconductor border therefore is relatively strongly curved downward. This indicates an intensive emission of enriched defect-electrons from the marginal or border region into the interior of the semiconductor layer with an increase in the concentration of defect-electrons.

During further process, the quasi Fermi level $E_F^{(p)}$ within the space charge region which increases with blocking voltage approaches the upper margin of the valence band and in specific regions may even enter from said valence band into the forbidden band. Thus, an increase in concentration of defect-electrons produced at the border of the semiconductor region is followed in a deeper area of the space charge region by a relative reduction of defect-electrons. This is due to the fact that the defect-electrons in the electric field of the applied voltage are drawn into the interior of the semiconductor region as a result of the expansion of the space charge depth. The two quasi Fermi levels gradually coincide in the quasi-neutral region of the semiconductor layer II as a result of a closer approach toward thermal balance conditions. The quasi Fermi level $E_F^{(p)}$ then proceeds either below or above the upper margin of the valence band in accordance with the level of doping.

The electronic conditions qualitatively illustrated in FIG. 4 are derived from those illustrated in FIG. 3. That is, due to the application of the blocking voltage, as in FIG. 2, an additional number of hot electrons photoelectrically excited in the metal layer II are issued or emitted into the conduction band of the semiconductor III. The electronic oscillation processes of the two electromagnetically varying coacting emission currents of hot electrons in the conduction band and of the enriched defect-electrons in the valence band of the semiconductor III are fully analogous to the electronic process of FIG. 2.

At a concentration of electrons which is comparable to the order of magnitude of a concentration of defect-electrons in the marginal area of the semiconductor region III, the quasi Fermi level $E_F^{(n)}$ of the electrons in the border region increases noticeably above the quasi Fermi level $E_F^{(p)}$ of the defect-electrons. Due to the return travel of hot electrons in the opposing electric field of the blocking voltage, a localized electron cloud is formed and is excited to oscillation by the issuance or emission of the subsequently following hot electrons.

The average electron concentration of the electron cloud may lie within the range of statistical degeneration when the emission current or flow is sufficiently dense and scattering in the range of statistical degeneration is relatively small. The quasi-Fermi level $E_F^{(n)}$ of the electrons thereby rises above the lower limit $E_C$ of the conduction band into the spatial range of the electron cloud, as shown in FIG. 4. The electron cloud is emitted and is usually localized. Due to the space charge density of the electron cloud, the potential deflection of the forbidden band in the border region of the semiconductor III is weakened and, with a sufficiently large accumulation of electrons, acquires a specific structural configuration, as shown in FIG. 4.

The difference between the electronic conditions shown in FIG. 4 and those shown in FIG. 2 is that the border concentrations of the defect-electrons is no longer constant and the issuance or emission of the electrons from the valence band of the semiconductor region III through the high-ohmic intermediate layer II*a* into the metal layer II is no longer influenced only by the applied blocking voltage, but also by the Coulomb repulsion of the electron cloud emitted into the condition band of said semiconductor region III.

In comparison with FIG. 2, therefore, the intermediate layer II*a* of FIG. 4 has a more sensitive control in the production of enriched defect-electrons at the semiconductor border, due to the space charge fluctuations of the electron cloud in the conduction band. Accompanying the conditions of an increased varying effect between the two enriched collective carriers, is an increase, in the internal modulation or coupling responsible for the reinforcement of oscillations, of the simultaneous double issuance or emission into the semiconductor region III of the hot electrons travelling in the same sense and the enriched defect-electrons.

The border or marginal concentration of the defect-electrons of FIG. 4, increased relative to the showing of FIG. 2 and controllable by the aforementioned influences, requires, however, a correspondingly higher quantum energy $h\nu$ in the monochromatic and coherent excitation radiation radiated into the metal layer II. The increase in quantum energy is required due to the strong electrostatic drop or difference in potential in the intermediate layer II*a*, as shown in FIG. 4.

The marginal or border concentration of defect-electrons and the difference or drop in potential in the intermediate layer II*a* increases the effective work function $A'_n$ of the electrons from the metal layer II into the conduction band of the semiconductor region III and varies said work function. The oscillations of the marginal concentrations of the defect-electrons are thus necessarily forcibly transmitted to the effective work function $A'_n$ of the electrons.

In the electronic processes illustrated in FIGS. 2 and 4, the photoelectric excitation of the hot electrons in the metal layer II must provide an electron issuance or emission into the conduction band and not into the valence band of the semiconductor layer III. This requirement is satisfied by the monochromatic excitation of the coherent radiation whereby the corresponding quantum energy $h\nu$ must always be higher than the work function of the electrons from the metal layer II into the conduction band of the semiconductor region III. In FIG. 4, the work function is even subjected to time variations. Particular attention must be paid to the band structure (not shown) and its relative position to the band structure of the semiconductor layer III.

Due to the monochromatic irradiation of the metal layer II with a quantum energy which satisfies the foregoing conditions, the excited metal electrons are raised into the next higher energy band of said metal layer II whereby the expansion vector of the electrons remains essentially unvaried during a slight varying coaction with the phonons of the crystal lattice. To insure that hot electrons are issued or emitted only into the conduction band of the semiconductor region III, the lower margin of the energy band of the metal layer II containing the excited electrons must still be considerably above the time variable maximum energy level $E_{VR}$ of the upper limit of the valence band of said semiconductor region III even when there is a drop or difference in potential within the intermediate layer II*a*. Under these circumstances, the excited electrons are issued or emitted from the metal layer II essentially exclusively into the conduction band of the semiconductor region III at a kinetic energy which is comparatively high relative to the level $E_{CR}$ of the conduction band.

Figure 5:
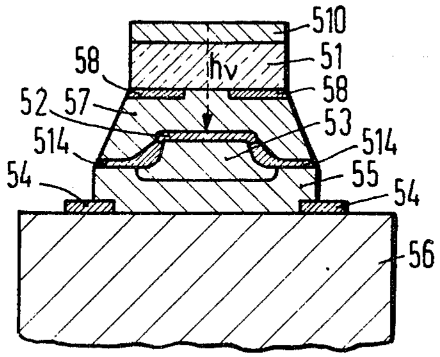
FIG. 5 is a schematic diagram of an embodiment of the active component of the present invention.
Figure 6:
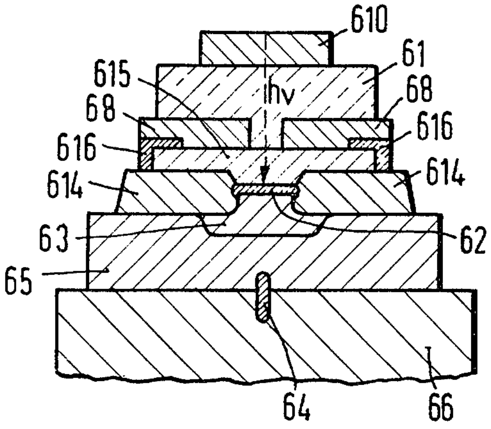
FIG. 6 is a schematic diagram of another embodiment of the active component of the present invention.
Figure 7:
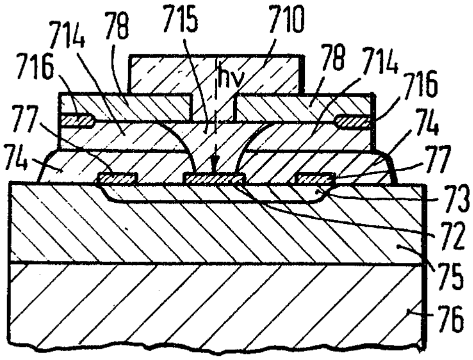
FIG. 7 is a schematic diagram of still another embodiment of the active component of the present invention.

The foregoing description of the physical processes relative to FIGS. 1 to 4 are now followed by a more specific disclosure of my invention with regard to three examples of operable embodiments of my invention. Three different basic components may generally be provided in communications technology, as shown in the examples of FIGS. 5, 6 and 7. Each of these basic components corresponds to a specific operating condition.

In a basic component A, the signal is impressed by a modulation of the issuance or emission of hot electrons from the metal layer II into the conduction band of the semiconductor region III of *p* conductivity type whereby a blocking voltage is applied on the semiconductor side of the junction or boundary between said metal layer and said semiconductor region. If the hot electrons are photoelectrically excited in the metal layer II by a dosed laser beam, the issued or emitted electrons are modulated by an appropriate variation of the laser radiation at a suitable frequency relative to that of the signal. The laser radiation may be varied, for example, by varying the intensity of the light controlling the laser in any suitable manner such as, for example, by optical or electrical means.

The plasma oscillations produced in the semiconductor layer III by the simultaneous issuance or emission of varying coacting hot electrons and defect-electrons are modulated in the basic component A by the signal oscillations of the electron emission whereby the blocking voltage determining the average flow of defect-electrons is kept constant between the metal layer II and in semiconductor region III of *p* conductivity type. The signal impressed upon the plasma oscillations is amplified with said plasma oscillations due to their feedback process and the simultaneous double injection of the two highly excited collective carriers.

The ultrahigh frequency oscillations produced in the semiconductor region III are radiated as electromagnetic waves into dielectric media bordering said semiconductor region III. The dielectric media bordering the semiconductor are designed as a conducting system or resonator for the microwave radiation, depending upon the frequency range of the available microwaves and their dielectric properties and geometrical configuration and corresponding to the modes of the microwave fields.

The plasma oscillations in the area of issuance or emission of the hot electrons and defect-electrons of the semiconductor region III represent, together with the modes of the irradiated microwave field, a common system of coupled oscillations. The aforedescribed basic component A is primarily suitable during operation as an amplifier of oscillations in the microwave region which are primarily produced. The basic component A is also suitable as a transmitter of the microwave radiation of the amplified signal frequency or as a microwave generator, upon appropriate design of its dielectric solid state resonator. The basic component A may provide for photoelectric excitation instead of modulation of a continuous emission of hot electrons. The photoelectric excitation may be in a variable pulse sequence by coherent laser radiation whereby the blocking voltage and the emission of hot defect-electrons are not varied externally.

In the second basic component B, the issuance or emission of hot electrons from the metal layer II into the semiconductor region III is not varied. However, the blocking voltage applied between the metal layer II and the semiconductor region III is periodically varied by superimposing thereon an external signal voltage. The superimposed signal voltage is provided by an external microwave field which is directed to the adjacent semiconductor region III by a dielectric waveguide and radiated into said semiconductor region. This modulates the plasma oscillations in the semiconductor region III at a frequency related to the frequency of the signal field.

The signal frequency of the plasma oscillations of the system of hot electrons and defect-electrons or holes modulated by the irradiated microwave field is amplified as electromagnetic oscillations derived from the total oscillation energy of the plasma oscillations and forcibly modulated. The amplified modulated oscillations may be emitted back into the dielectric guidance system of the microwave field or it may be transmitted by said system. For a better understanding of this phenomenon, it should be repeated that the oscillation energy of the plasma oscillations of the hot electrons and holes is energized and constantly supplied with respect to electrons by the photoelectric excitation energy of the coherent light beam which penetrates the metal layer II and is energized and constantly supplied with respect to enriched defect-electrons by the applied blocking voltage between said metal layer II and the semiconductor region III.

The basic component C represents a combination of both components A and B. Thus, the blocking voltage applied between the metal layer II and the semiconductor region III is periodically varied in accordance with basic component B by superimposing a microwave field while simultaneously the emission or issuance of hot electrons from the metal layer II into the conduction band of the semiconductor III is modulated with an impressed modulation frequency of the photoelectric excitation of the light radiated into said metal layer II. The oscillation of the issuance or emission of hot electrons may occur at the same frequency as the periodic variation of the blocking voltage or at a harmonic of the signal frequency whereby the phase position of the two periodic oscillations may be arbitrarily controlled. This permits the amplifying of a frequency modulation as well as the producing of a discrete frequency spectrum with an adjustable intensity distribution. Furthermore, the frequency of the emission fluctuations of the hot electrons may differ from the signal frequency of the variation of the blocking voltage. This creates surges or combination frequencies which are amplified and radiated in the dielectric conducting system for microwaves.

The crystal adjacent the semiconductor region III is either a component of the conductance system of the microwave itself or it represents a lead for the microwave between a conventional microwave conductor or waveguide and the oscillation system of the present invention. The crystal assumes an analogous function when the component of the present invention is developed as a microwave resonator.

The configuration, bounds or limits, magnitude and dielectric properties of the crystal adjacent to the semiconductor region III depend upon the desired type of oscillations and the frequency range of the amplified or generated ultrahigh frequency oscillations. In the range of centimeter waves, the crystal dimensions correspond to the dimensions of conventional conductance systems for centimeter waves. In connection with oscillations in the millimeter and submillimeter range, the dimensions of the crystal substrate designed as a wave conductor or as a resonator for the semiconductor region III may be considerably smaller. The crystal which includes the semiconductor region III is, for example, a semiconductor itself or a semiconductor layer. It is developed as a conductor or a resonator for millimeter or submillimeter waves in the appropriately small crystal area by conventional means of the semiconductor art of a type indicated in the following embodiment examples.

FIG. 5 illustrates a first embodiment and a first example of the component of the present invention. In FIG. 5, a light beam with quantum energy $h\nu$ is emitted by a light source 51. The light beam penetrates the metal layer 52, wherein it is completely absorbed and produces therein hot electrons by photoelectric means. The metal layer 52 corresponds in its properties and in its mode of operation with and constitutes the afore-described metal layer II.

The light source 51 is the region I of FIGS. 1 to 4. The radiation emitted from the region I may comprise, for example, electroluminescent or photoluminescent radiation, but preferably comprises laser radiation or a laser beam. If the radiation is laser radiation, the light source 51 is, for example, a laser diode or other laser-active device. The light source 51 may, for example, more specifically comprise a laser-active glass layer doped with ions which may be stimulated.

According to a special embodiment of the present invention, the glass layer may be combined with a light source comprising an additional continuously glowing layer 510. The light source 510 is optically coupled to the glass layer 51 and functions as an optical pump. The light source 510 thus assumes a double function. To provide a pulse operated laser beam via the stimulated glass layer 51, the continuously glowing layer 510 delivers a continuous basic radiation via said glass layer for the excitation of hot electrons in the metal layer 52. Furthermore, the radiation of the continuously glowing layer 510 as well as the continuous excitation energy may be utilized to stimulate the laser-active glass layer 51. This is preferably done when the emission of the glass layer 51 is entirely or at least partly continuous light radiation.

A diaphragm or mask 58 limits the diameter of the light beam for photoelectric excitation of hot electrons in the metal layer 52, in such a manner that no radiation may impinge laterally beyond a specified area or the central area of the metal layer 52. This prevents the radiation from producing undesirable photoelectric effects. The mask 58 is interposed between the glass layer 51 and the metal layer 52.

A layer 57 is interposed between the glass layer 51 and the metal layer 52. The layer 57 comprises a body of good heat conductivity which partly absorbs the light beam which penetrates it. These characteristics of the layer 57 permit the removal of heat from the metal layer 52. Furthermore, prior to its entry into the metal layer 52, the laser beam may be dosed in a manner determined by the intensity of the photoelectric excitation of hot electrons. This provides sufficient freedom of choice with respect to the effectively active optical thickness of the metal layer 52 and for the adaptation or adjustment of its geometrical thickness to the order of magnitude of the damping length of the hot electrons within the metal layer 52.

The quantum energy of the light beam emitted from the glass layer or source 51 of light or radiation or from the continuously glowing layer 510, which is at least partly coherent, is so great that the hot electrons photoelectrically excited thereby in the metal layer 52 are emitted into the conductance band of the adjacent semiconductor region or layer 53 when the thickness of said metal layer is in the order of magnitude of several damping lengths of the hot electrons. The semiconductor region 53 is of strong *p* conductivity type and may be either diffused or alloyed into an adjacent semiconductor layer 55. The semiconductor layer 55 is of *p* conductivity type and is of higher ohmic resistance than the layer 53.

The semiconductor layer 53 has at its junction or boundary with the metal layer 52 an enrichment layer of defect-electrons with a defect-electron concentration distribution in the range of statistical degeneration. The semiconductor region 53 may include a statistically degenerated region of *p* conductivity type, at least partially, in its interior. The statistically degenerated region corresponds in its properties to the semiconductor region III described in FIGS. 1 to 4, wherein the afore-disclosed ultrahigh frequency oscillations of the plasma of hot electrons and enriched defect-electrons occur.

In a special embodiment of the component of the present invention, semiconductor regions or layers 53 and 55 may constitute a monocrystalline structure having a continuous concentration distribution of acceptors without a sharp variation in concentration and constituting a boundary of doping continuity which differentiates the two regions. Adjacent the metal layer 52, the semiconductor region 53 rises mesa-like from the semiconductor layer 55 but comprises the same base crystal.

In another modification of the device of FIG. 5, the semiconductor region 53 of strong *p* conductivity type may be vapor deposited upon the semiconductor layer 55 or may be applied to said layer as an epitaxial layer. A body 56 functions as a carrier body or carrier plate for the crystal arrangement which is stacked in layers 55, 53, 52, 57, 51, 510. The carrier body 56 has dielectric properties and a structure which makes it suitable as a microwave conductor for the intended frequency range and said carrier body may be so utilized.

The carrier body 56 provides a number of conventional possibilities. The carrier body 56 may have a hollow area, space, chamber, or the like formed therein. The hollow area may be wholly or partly gas-filled or evacuated hollow space and the carrier body 56 may be designed as a hollow conductor or as a resonator for microwave radiation. A layer 514 comprising electrical insulation such as, for example, an oxide layer, is interposed between the layer 57 of good heat conductivity and the semi-conductor layer 55 for the purpose of preventing an undesirable shunt between said layers 57 and 55.

A variable blocking voltage is applied between the semiconductor layer 53 of strong *p* conductivity type and the metal layer 52 via an ohmic contact electrode 54. The semiconductor layer 53 corresponds to the semiconductor region III, described with reference to FIGS. 1 to 4, in its properties and characteristics. The semiconductor region 53 has a non-inverted defect-electron enrichment layer with a defect-electron concentration distribution in the range of statistical degeneration in its area adjacent its junction or boundary with the metal layer 52. Therefore, when blocking voltage is applied, enriched defect-electrons are issued or emitted from the junction or boundary surface between the metal layer 52 and the semiconductor region 53 into the interior of the semiconductor region 53.

The issuance or emission of enriched defeat-electrons into the valence band of the semiconductor region 53 occurs simultaneously and in the same starting direction as the issuance or emission of hot electrons from the metal layer 52 into the valence band of the semiconductor region 53. Due to the high photoelectric excitation intensity of the coherent optical radiation from the laser-active layer 51, the average concentration of the emitted hot electrons may be compared in magnitude with the concentration of enriched defect-electrons. The emitted hot electrons travel against the electric field of the applied blocking voltage due to their high kinetic starting energy and reverse their direction of travel or movement in the conduction band of the semiconductor region 53. This produces an electron cloud which is formed in an average length of time by the hot electrons moving in forward and reverse directions and involves the recombination losses and scattering processes in the border area of the semiconductor region 53.

The electron cloud is formed of additional, predominantly hot electrons ahead of the metal layer 52. The average concentration of the electron cloud may, at an appropriately small recombination rate and in association with strong electron emissions and an appropriately selected blocking voltage, exceed the defect-electron concentration occuring in an average length of time in a specific part of the border area of the semiconductor region 53. Thus, within such specific part of said border area, in the vicinity of the space charge center of gravity of the electron cloud of additional hot electrons, an inverted population condition occurs. The electron cloud of excited electrons in the conduction band of the semiconductor region 53 is localized in average length of time and constitutes an oscillatory collection of electrons with variable natural frequencies.

The inherent frequencies of the plasma oscillations lie, in accordance with the potential and space charge distribution and the concentration of the electron cloud (FIG. 2), in the range of ultrahigh frequency electromagnetic oscillations and may be arbitrarily adjusted or varied by appropriate adjustment of the intensity of photoelectrically excited electron emissions and adjustment of the blocking voltage applied between the metal layer 52 and the semiconductor region 53 within the spectral region of centimeter to submillimeter waves.

The oscillations of the electron cloud which are localized in an average period of time and comprise hot electrons are transmitted by an electromagnetic varying effect on the emission of enriched defect-electrons.

The two collective carriers derived from independent energy sources and comprising highly excited electrons and defect-electrons and having comparable magnitudes of carrier concentrations thereby form a two component semiconductor plasma with an internal coupling or feedback between the collective excited electrons and the enriched defect-electrons. This phenomenon of an oscillatory electronic system with an internal coupling or feed-back results in the fact that during the double emission of hot electrons and enriched defect-electrons from the same metal layer 52 into the semiconductor region 53 of strong *p* conductivity type the electrodynamic varying effect which is simultaneously produced thereby results in an essentially inertia-free internal feedback between the simultaneous ultrahigh frequency fluctuations of both energetically excited collective carriers. In a high frequency generator, this may produce amplification of the ultrahigh frequency self-oscillations of the entire electronic system whose frequencies are adjustable by variation of the emission of hot electrons and the applied blocking voltage. In an amplifier, this may produce amplification of the ultrahigh frequency oscillations modulated by an external microwave field as well as amplification of the modulated frequencies. As hereinbefore explained, the modulation of forcibly produced frequencies may be produced by a microwave field superimposed upon the blocking voltage applied between the layers 52 and 53 and transmitted to the carrier body 56 and acting upon the oscillations of the semiconductor plasma in the layer 53. The blocking voltage is applied to the ohmic contact electrode 54 and to the metal layer 52. The modulation may also be produced by variations in the photoelectric excitation of hot electrons in the metal layer 52 by coherent optical radiation radiated from the layer 51 whereby the emission of hot electrons from said metal layer into the semiconductor region 53 is controlled by maintaining the phase correlation at the modulating frequency.

In the embodiments or examples of FIGS. 6 and 7, analogous parts of the component of my invention perform the same functions as they do in the embodiment of FIG. 5 and are therefore described with relation to FIG. 5 and not with relation to FIGS. 6 and 7.

In the embodiment of FIG. 6, the optical beam for the photoelectric excitation of hot electrons in the metal layer 62 is produced in the laser-active crystal or glass layer 61. The glass layer 61 is optically coupled with the luminescence layer 610. The cross-section of the optical beam is adjusted to the dimensions of the metal layer 62 by a masking layer or diaphragm 68.

The dosing of the optical beam is controlled in this embodiment example by a photocurrent flowing in a semiconductor layer 615 interposed between the metal layer 62 and the layer 61. The photocurrent flows between the metal layer 62 and an electrode 616. The absorption in the semiconductor layer 615 may be varied as a function of the carrier concentration and the electronic populating condition.

The insulating layer 614 insulates or separates the foregoing processes from the plasma oscillations within the semiconductor region 63. The plasma oscillations are produced in the semiconductor layer 63 by a simultaneous double issuance or emission of hot electrons and enriched defect-electrons from the metal layer 62 into said semiconductor layer. The mesa-like semiconductor region 63 is crystallographically impressed into the semiconductor monocrystalline layer 65, which is adjacent the microwave conducting carrier body 66 and is permeable to the frequencies thereof. The blocking voltage between the metal layer 62 and the semiconductor region 63 utilized for the control of the plasma oscillations, is applied via an electrode 64 which is superimposed by the electric varying field of the microwave radiation.

The embodiment of FIG. 7 is considerably simplified in structure, especially with respect to technology. In the embodiment of FIG. 7, the semiconductor region 73 is no longer developed as a mesa but is impressed into the monocrystalline semiconductor layer 75 in a planar manner. The thin metal layer 72 for the photoelectric excitation of hot electrons is applied as a coating to the surface of the semiconductor layer 75. An electrode 77 for applying the blocking voltage is positioned on the surface of the layer 75 between said layer and an insulating masking layer 74. The electrode 77 is positioned on the planar surface of the semiconductor region 73.

The insulating masking layer 74 and the electrode 77 coat the surface of the semiconductor layer 75. A semiconductor layer 714 adjacent the masking layer 74 has a central semiconductor region 715 of *n* conductivity type. The masking layer 74 confines the optical beam to the metal layer 72. The semiconductor layer 714 is of *p* conductivity type in the area traversed by the optical beam having a quantum energy $h\nu$ and an ohmic contact electrode 616 contacts said semiconductor layer.

The laser beam which is radiated into the metal layer 72 from the light source 710 is dosed by controlling the absorption of said radiation in the semiconductor layer 715. This is accomplished with the assistance of a variable control voltage which is applied between the electrode 716 and the metal layer 72. The final step in the electronic process is the control of the absorption characteristics of the semiconductor layer 715. This is accomplished by superimposing a signal frequency in a manner whereby an outside circuit feeds back the oscillations having the modulation frequency of ultrahigh frequency plasma oscillations to the signal oscillations of the blocking voltage applied between electrode 77 and the metal layer 72. The carrier plate 76 is, as in the embodiments of FIGS. 5 and 6, a microwave conducting body and may comprise a hollow conductor.

The dielectric insulation layer II*a* between the solid state layer having degenerated electron concentration and the semiconductor layer of *p* conductivity type, as described in FIGS. 3 and 4, is not shown in the examples of FIGS. 5, 6 and 7. However, based on the descriptions relating to FIGS 3 and 4, it is readily apparent that such a layer may be provided in the embodiments of FIGS. 5, 6 and 7.

A heat conducting layer such as, for example, the layer 57, of the embodiment of FIG. 5 of my invention, is interposed between the light source such as, for example, the layer 51, and the metal layer such as, for example, the layer 52, and functions to absorb the optical radiation to an extent determined by its thickness between said layers. The heat conducting layer such as, for example, the semiconductor layer 715 of the embodiment of FIG. 7, comprises a semiconductor body such as, for example, the semiconductor layer 714, having a surface with an electrode such as, for example, the electrode 716, at such surface for producing in the semiconductor body an electric field substantially perpendicular to the direction of the optical radiation. The semiconductor layer 714 of *p* conductivity type is separated from the semiconductor body 715 of *n* conductivity type in the embodiment of FIG. 7 by p-n junctions formed between them.

While the invention has been described by means of specific examples and in specific embodiments, I do not wish to be limited thereto for obvious modifications will occur to those skilled in the art without departing from the spirit and scope of the invention.

I claim:

1. An active component for generating and amplifying ultrahigh frequency signals in the frequency range between the maximum communication technical frequency and long wave infrared frequency, said component comprising a first solid state layer of degenerated electron concentration; a light source arranged to radiate optical radiation into said first layer, said first layer having a thickness sufficient for complete absorption of said optical radiation and at least in the order of magnitude of a few damping lengths of electrons photoelectrically excited in said first layer but not larger than in the order of $10^2$ to $10^3$ of said damping lengths; and a second layer adjacent to and forming a junction with said first layer and comprising semiconductor material of *p* conductivity type having a statistically degenerated defect-electron enrichment layer, said second layer having ohmic contact means for applying blocking direct voltage between said first and second layers, the optical radiation of said light source having a frequency corresponding to a photon energy greater than the work function of the hot electrons issuing from said first layer into the conduction band of said semiconductor material and having an intensity at which the median concentration of the localized hot electron cloud occurring at the junction between said first and second layers with a determined blocking direct voltage applied thereto via the ohmic contact means of said second layer is comparable in order of magnitude with the median concentration of the defect-electron enrichment layer of said semiconductor material.

2. An active component as claimed in claim 1, wherein the density of the electrons issuing from said first layer into the conduction band of said semiconductor material is so large that the median concentration of the localized hot electron cloud occurring at the junction between said first and second layers with a determined blocking direct voltage applied thereto via the ohmic contact means of said second layer is comparable in order of magnitude with the median concentration of the defect-electron enrichment layer of said semiconductor material.

3. An active component as claimed in claim 1, wherein said first layer comprises metal.

4. An active component as claimed in claim 1, wherein said light source comprises a source of electro-luminescent radiation.

5. An active component as claimed in claim 1, wherein said light source comprises a source of photo-luminescent radiation.

6. An active component as claimed in claim 1, wherein said light source comprises a source of laser radiation.

7. An active component as claimed in claim 1, wherein said light source comprises a laser-active glass layer doped with ions which may be stimulated and an optical pump comprising a continuously glowing light source optically coupled with said glass layer.

8. An active component as claimed in claim 1, wherein said light source comprises a laser-active glass layer doped with ions which may be stimulated and an optical pump comprising a continuously glowing light source optically coupled with said glass layer and arranged relative to said glass layer and said first layer so that the optical beam of said glowing light source passes through said glass layer into said first layer to provide continuous basic excitation of hot electrons in said first layer.

9. An active component as claimed in claim 1, wherein said light source comprises a laser diode.

10. An active component as claimed in claim 1, further comprising means interposed between said light source and said first layer for concentrating said optical radiation on the central area of said first layer.

11. An active component as claimed in claim 1, further comprising a heat conducting layer having a thickness interposed between said light source and said first layer for absorbing said optical radiation to an extent determined by its thickness and for dosing said optical radiation.

12. An active component as claimed in claim 1, wherein the statistically degenerated defect-electron enrichment layer of said semiconductor material is formed by a reregion of said semiconductor material adjacent said first layer, said region being highly doped up to degeneration relative to the remainder of said semiconductor material.

13. An active component as claimed in claim 1, wherein the statistically degenerated defect-electron enrichment layer of said semiconductor material is developed in a continuous concentration distribution of acceptors free from a sharp variation in concentration in said semiconductor material.

14. An active component as claimed in claim 1, wherein the statistically degenerated defect-electron enrichment layer is an epitaxially grown layer on said semiconductor material.

15. An active component as claimed in claim 1, wherein the statistically degenerated defect-electron enrichment layer is a vapor deposited layer on said semiconductor material.

16. An active component as claimed in claim 1, wherein the semiconductor material is formed as a mesa on said second layer and the statistically degenerated defect-electron enrichment layer is localized in said mesa.

17. An active component as claimed in claim 1, further comprising an insulating layer for preventing shunts, and wherein the semiconductor material is formed as a mesa on said second layer, the statistically degenerated defect-electron enrichment layer is localized in said mesa, said first layer is adjacent the mesa of said second layer and said insulating layer is provided on a determined part of said second layer.

18. An active component as claimed in claim 1, wherein the statistically degenerated defect-electron enrichment layer is planarly localized in said semiconductor material.

19. An active component as claimed in claim 1, further comprising a heat conducting layer having a thickness interposed between said light source and said first layer for aborbing said optical radiation to an extent determined by its thickness and for dosing said optical radiation, said heat conducting layer comprises a semiconductor body having a surface with electrode means at said surface for producing in said semiconductor body an electric field substantially perpendicular to the direction of said optical radiation.

20. An active component as claimed in claim 1, further comprising a carrier body supporting said second layer at its surface opposite that adjacent said first layer, said carrier body comprising a microwave conductor.

21. An active component as claimed in claim 1, further comprising an insulating layer between said first and second layers.

22. An active component as claimed in claim 1, further comprising means for impressing a signal upon said optical radiation and means for maintaining a blocking direct voltage between said first and second layers at the ohmic contact means of said second layer, said signal being transferred to said semiconductor material and amplified by the simultaneous emission of hot electrons and enriched defect-electrons.

23. An active component as claimed in claim 1, further comprising means for impressing a signal upon the blocking direct voltage applied between said first and second layers and means for maintaining the intensity of said optical radiation, said signal being transferred to said semiconductor material and amplified by the simultaneous emission of hot electrons and enriched defect-electrons.

24. An active component as claimed in claim 19, wherein p-n junctions are formed between and separate the semiconductor body of said heat conducting layer from the remainder of said heat conducting layer.

References Cited

UNITED STATES PATENTS

| | | | |
|---|---|---|---|
| 3,102,201 | 8/1963 | Braunstein et al. | 332—7.51 |
| 3,369,132 | 2/1968 | Fang et al. | 317—235 |

RODNEY D. BENNETT, Primary Examiner

C. EWANDS, Assistant Examiner

U.S. Cl. X.R.

307—312; 331—94.1